US012568699B2

(12) United States Patent
Kobayashi

(10) Patent No.: US 12,568,699 B2
(45) Date of Patent: Mar. 3, 2026

(54) PHOTOELECTRIC CONVERSION DEVICE

(71) Applicant: CANON KABUSHIKI KAISHA, Tokyo (JP)

(72) Inventor: Hideo Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 493 days.

(21) Appl. No.: 18/168,347

(22) Filed: Feb. 13, 2023

(65) Prior Publication Data

US 2023/0282654 A1     Sep. 7, 2023

(30) Foreign Application Priority Data

Mar. 1, 2022    (JP) ................................. 2022-030679

(51) Int. Cl.
*H10F 39/00*            (2025.01)
(52) U.S. Cl.
CPC ....... *H10F 39/802* (2025.01); *H10F 39/8037* (2025.01); *H10F 39/8063* (2025.01); *H10F 39/809* (2025.01); *H10F 39/811* (2025.01)
(58) Field of Classification Search
CPC ............... H10F 39/802; H10F 39/8037; H10F 39/8063; H10F 39/809; H10F 39/811
See application file for complete search history.

(56) References Cited

U.S. PATENT DOCUMENTS 7,990,440 B2      8/2011  Kobayashi
8,570,417 B2 *  10/2013  Oike ....................... H04N 25/78
                                                             348/308

8,710,558 B2      4/2014  Inoue
8,884,391 B2    11/2014  Fudaba
9,264,641 B2      2/2016  Kobayashi
9,305,954 B2      4/2016  Kato
9,357,122 B2      5/2016  Kususaki
9,407,847 B2      8/2016  Maehashi
9,438,828 B2      9/2016  Itano
(Continued)

FOREIGN PATENT DOCUMENTS

WO      WO-2019069614 A1 *   4/2019   ........... H04N 25/616

OTHER PUBLICATIONS

U.S. Appl. No. 17/963,289, filed Oct. 11, 2022, by Hideo Kobayashi.
(Continued)

*Primary Examiner* — Ahmed A Berhan
(74) *Attorney, Agent, or Firm* — VENABLE LLP

(57)            ABSTRACT

A photoelectric conversion device includes a pixel, a signal line connected to the pixel, and a first signal holding unit to which a signal is input from the pixel via the signal line. The first signal holding unit includes a first capacitor element and a second capacitor element each configured to hold a signal input from the signal line to a first terminal, an amplifier circuit in which a second terminal of the first capacitor element and a second terminal of the second capacitor element is connected to an input terminal, a first switch connected between the first terminal of the first capacitor element and an output terminal of the amplifier circuit, a second switch connected between the first terminal of the second capacitor element and the output terminal of the amplifier circuit, and a third switch connected to the input terminal of the amplifier circuit.

23 Claims, 18 Drawing Sheets

(56) References Cited

U.S. PATENT DOCUMENTS

| | | | |
|---|---|---|---|
| 9,509,931 | B2 | 11/2016 | Kobayashi |
| 9,602,752 | B2 | 3/2017 | Kobayashi |
| 10,015,430 | B2 | 7/2018 | Kobayashi |
| 10,609,316 | B2 | 3/2020 | Kobayashi |
| 11,268,851 | B2 | 3/2022 | Kobayashi |
| 11,431,929 | B2 | 8/2022 | Kobayashi |
| 11,463,644 | B2 | 10/2022 | Soda |
| 11,470,275 | B2 | 10/2022 | Kobayashi |
| 11,496,704 | B2 | 11/2022 | Sato |
| 11,616,925 | B2 | 3/2023 | Kobayashi |
| 11,653,114 | B2 | 5/2023 | Nakazawa |
| 2015/0215561 | A1* | 7/2015 | Maehashi .............. H04N 25/77 348/308 |
| 2021/0360180 | A1 | 11/2021 | Saito |
| 2022/0030164 | A1 | 1/2022 | Kobayashi |
| 2022/0247964 | A1 | 8/2022 | Kobayashi |
| 2022/0302199 | A1 | 9/2022 | Kobayashi |
| 2022/0303484 | A1 | 9/2022 | Kobayashi |
| 2022/0303485 | A1 | 9/2022 | Kobayashi |
| 2022/0303486 | A1 | 9/2022 | Kobayashi |
| 2022/0321812 | A1 | 10/2022 | Kobayashi |
| 2023/0041974 | A1 | 2/2023 | Kobayashi |
| 2023/0070568 | A1 | 3/2023 | Kobayashi |
| 2023/0072715 | A1 | 3/2023 | Kobayashi |
| 2023/0117988 | A1 | 4/2023 | Kobayashi |

OTHER PUBLICATIONS

U.S. Appl. No. 17/971,797, filed Oct. 24, 2022, by Hideo Kobayashi.
U.S. Appl. No. 17/981,657, filed Nov. 7, 2022, by Hideo Kobayashi.
U.S. Appl. No. 18/074,642, filed Dec. 5, 2022, by Kazuo Yamazaki.
U.S. Appl. No. 18/068,622, filed Dec. 20, 2022, by Hideo Kobayashi.
U.S. Appl. No. 18/158,554, filed Jan. 24, 2023, by Hideo Kobayashi.

* cited by examiner

FIG. 13

PHOTOELECTRIC CONVERSION DEVICE

BACKGROUND OF THE INVENTION

Field of the Invention

The present disclosure relates to a photoelectric conversion device.

Description of the Related Art

A solid-state imaging element having a sample-and-hold circuit for holding a signal output from a pixel is disclosed in International Publication No. WO2019/069614.

In a photoelectric conversion device having a function of holding a signal as disclosed in International Publication No. WO2019/069614, improvement in accuracy of an output signal is required.

SUMMARY OF THE INVENTION

An object of the present disclosure is to provide a photoelectric conversion device in which accuracy of an output signal is improved.

According to a disclosure of the present specification, there is provided a photoelectric conversion device including a pixel configured to output a signal corresponding to incident light by photoelectric conversion, a signal line connected to the pixel, and a first signal holding unit to which a signal is input from the pixel via the signal line. The first signal holding unit includes a first capacitor element and a second capacitor element each having a first terminal and a second terminal and each configured to hold a signal input from the signal line to the first terminal, an amplifier circuit having an input terminal and an output terminal, the second terminal of the first capacitor element and the second terminal of the second capacitor element being connected to the input terminal, a first switch connected between the first terminal of the first capacitor element and the output terminal of the amplifier circuit, a second switch connected between the first terminal of the second capacitor element and the output terminal of the amplifier circuit, and a third switch connected to the input terminal of the amplifier circuit.

According to a disclosure of the present specification, there is provided a photoelectric conversion device including a plurality of pixels each configured to output a signal corresponding to incident light by photoelectric conversion, a plurality of signal lines connected to the plurality of pixels, a plurality of first signal holding units, and a plurality of multiplexers, corresponding signal lines of the plurality of signal lines being connected to an input side of each of the plurality of multiplexers, a corresponding first signal holding unit of the plurality of first signal holding units being connected to an output side of each of the plurality of multiplexers. Each of the plurality of first signal holding units includes a first capacitor element and an amplifier circuit connected to the first capacitor element. The amplifier circuit included in a first signal holding unit of a part of the plurality of first signal holding units and the amplifier circuit included in a first signal holding unit of another part of the plurality of first signal holding units are connected to different control lines.

Further features of the present invention will become apparent from the following description of exemplary embodiments with reference to the attached drawings.

BRIEF DESCRIPTION OF THE DRAWINGS

FIG. 13 is a block diagram illustrating a schematic configuration of a photoelectric conversion device according to a seventh embodiment.

DESCRIPTION OF THE EMBODIMENTS

Figure 1:
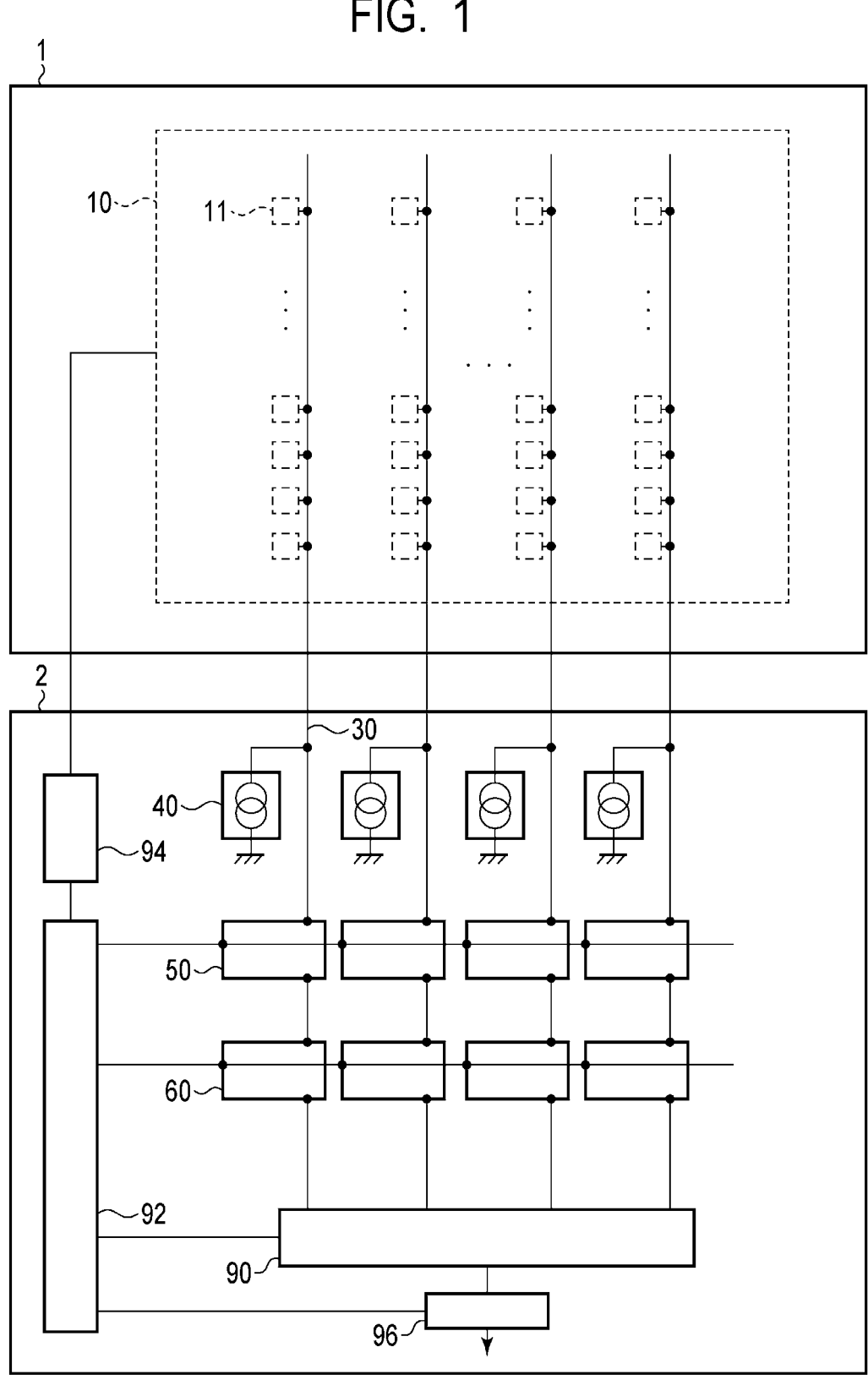
FIG. 1 is a block diagram illustrating a schematic configuration of a photoelectric conversion device according to a first embodiment.

Preferred embodiments of the present invention will now be described in detail in accordance with the accompanying drawings. In the drawings, the same or corresponding elements are denoted by the same reference numerals, and the description thereof may be omitted or simplified.

In the following first to eleventh embodiments, an imaging device will be mainly described as an example of a photoelectric conversion device. However, the photoelectric conversion device of each embodiment is not limited to the imaging device, and can be applied to other photodetection devices based on photoelectric conversion. Examples of other photodetection devices include a ranging device and a photometry device. The ranging device may be, for example, a focus detection device, a distance measuring device using a time-of-flight (TOF), or the like. The photometry device may be a device for measuring the amount of light incident on the device.

First Embodiment

FIG. 1 is a block diagram illustrating a schematic configuration of a photoelectric conversion device according to the present embodiment. The photoelectric conversion device includes a pixel array 10, vertical signal lines 30, current sources 40, sample-and-hold units 50, conversion units 60, a data processing unit 90, a control circuit 92, a vertical scanning circuit 94, and an output circuit 96. The pixel array 10 is arranged in a pixel substrate 1 (first substrate). The current sources 40, the sample-and-hold units 50, the conversion units 60, the data processing unit 90, the control circuit 92, the vertical scanning circuit 94, and the output circuit 96 are arranged in a circuit substrate 2 (second substrate). The pixel substrate 1 and the circuit substrate 2 are different semiconductor substrates and are stacked on each other.

The pixel array 10 includes a plurality of pixels 11 arranged in a matrix of a plurality of rows and a plurality of columns. Each of the plurality of pixels 11 includes a photoelectric conversion unit having a photoelectric conversion element such as a photodiode. The pixel 11 outputs a photoelectric conversion signal that is an analog signal corresponding to the amount of light incident on the photoelectric conversion element. Also, the pixel 11 outputs a reset signal that is an analog signal of a noise level in a reset state. Here, a row direction indicates the left-right direction in FIG. 1, and a column direction indicates the up-down direction in FIG. 1. In the pixel array 10, a vertical signal line 30 for transmitting the photoelectric conversion signal and the reset signal is arranged along the column direction corresponding to each column in which the pixels 11 are arranged.

The control circuit 92 supplies control signals for controlling operations and timings to the sample-and-hold units 50, the conversion units 60, the data processing unit 90, the vertical scanning circuit 94, and the output circuit 96. At least a part of the control signals supplied to the sample-and-hold units 50, the conversion units 60, the data processing unit 90, the vertical scanning circuit 94, and the output circuit 96 may be supplied from the outside of the photoelectric conversion device.

The vertical scanning circuit 94 is a scanning circuit having a function of receiving a control signal output from the control circuit 92, generating a control signal for driving the pixel 11, and supplying the control signal to the pixel 11. A logic circuit such as a shift register or an address decoder may be used for the vertical scanning circuit 94. The vertical scanning circuit 94 supplies control signals to the pixels 11 through control lines arranged for each row of the pixel array 10, thereby driving the pixels 11 in a row basis. The signals read out from the pixels 11 in a row basis are input to the sample-and-hold unit 50 via vertical signal line 30 provided in each column of the pixel array 10.

The current source 40 is arranged corresponding to each of the vertical signal lines 30. The current source 40 supplies a bias current for signal reading to the pixel 11 of a row selected by the control of the vertical scanning circuit 94 via the vertical signal line 30.

The sample-and-hold unit 50 samples and holds the signal generated by the photoelectric conversion element of the pixel 11 in the corresponding column via the vertical signal line 30. The sample-and-hold unit 50 includes two circuits that are a sample-and-hold circuit for sampling the reset signal and a sample-and-hold circuit for sampling the photoelectric conversion signal (sample-and-hold circuits 50N and 50S described later).

The conversion unit 60 includes an analog-to-digital conversion circuit that converts an analog signal output from the sample-and-hold unit 50 of the corresponding column into a digital signal. Examples of the analog-to-digital conversion circuit include, but are not limited to, a slope-type analog-to-digital conversion circuit, a successive-approximation analog-to-digital conversion circuit, and a delta-sigma ($\Delta\Sigma$) analog-to-digital conversion circuit. In the present embodiment, the conversion unit 60 includes a delta-sigma analog-to-digital conversion circuit.

The data processing unit 90 is a digital signal processing circuit that processes a digital signal output from the conversion unit 60 of each column. For example, the data processing unit 90 may perform correction processing, complement processing, and the like on the digital signal output from the conversion unit 60. The output circuit 96 outputs the digital signal processed by the data processing unit 90 to the outside of the photoelectric conversion device.

Figure 2:
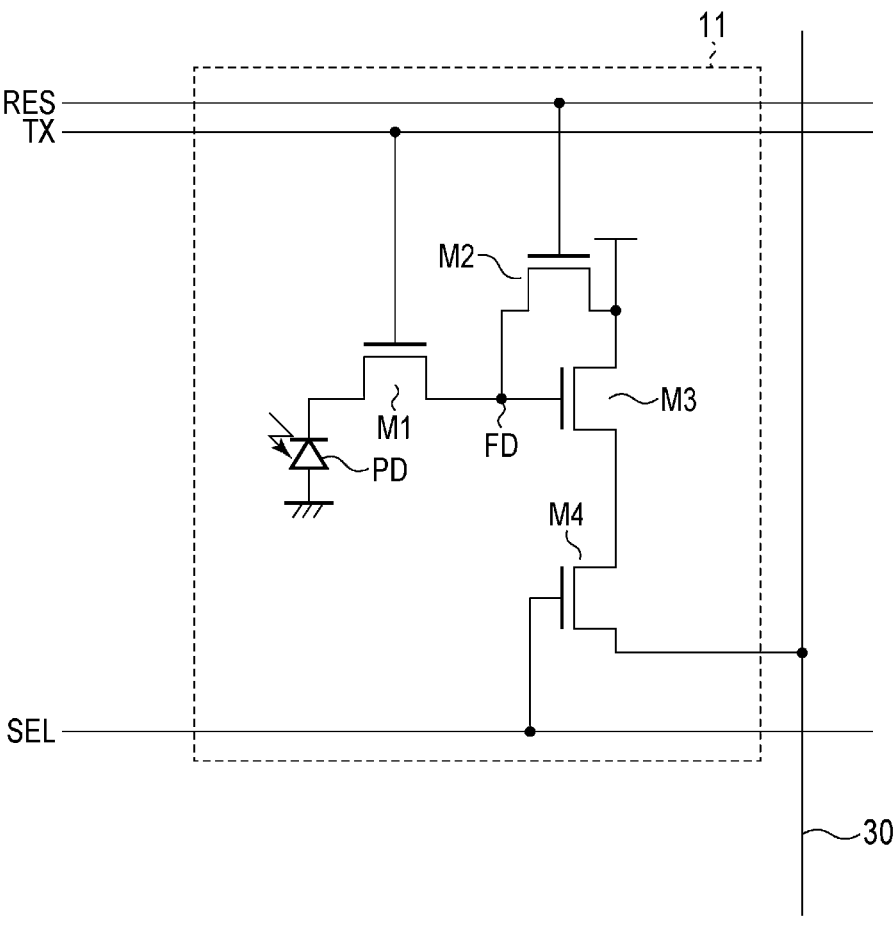
FIG. 2 is a circuit diagram of a pixel according to the first embodiment.

FIG. 2 is a circuit diagram of the pixel 11 according to the present embodiment. The pixel 11 includes a photoelectric conversion element PD, a transfer transistor M1, a reset transistor M2, an amplification transistor M3, and a selection transistor M4.

The photoelectric conversion element PD is, for example, a photodiode. The anode of the photoelectric conversion element PD is connected to a ground node, and the cathode of the photoelectric conversion element PD is connected to the source of the transfer transistor M1. The drain of the transfer transistor M1 is connected to the source of the reset transistor M2 and the gate of the amplification transistor M3. A node FD to which the drain of the transfer transistor M1, the source of the reset transistor M2, and the gate of the amplification transistor M3 are connected is a so-called floating diffusion portion. The floating diffusion portion has a capacitance component (floating diffusion capacitance) and functions as a charge holding portion. The floating diffusion capacitance includes a PN junction capacitance, a wiring capacitance, and the like.

The drain of the reset transistor M2 and the drain of the amplification transistor M3 are connected to a power supply voltage node to which a voltage VDD is supplied. The source of the amplification transistor M3 is connected to the drain of the selection transistor M4. The source of the selection transistor M4 is connected to the vertical signal line 30.

In the case of the pixel configuration of FIG. 2, the control line of each row includes a signal line connected to the gate of the transfer transistor M1, a signal line connected to the gate of the reset transistor M2, and a signal line connected to the gate of the selection transistor M4. A control signal TX is supplied from the vertical scanning circuit 94 to the gate of the transfer transistor M1. A control signal RES is supplied from the vertical scanning circuit 94 to the gate of the reset transistor M2. A control signal SEL is supplied from the vertical scanning circuit 94 to the gate of the selection transistor M4. A plurality of pixels 11 in the same row are connected to common signal lines, and are controlled at the same time by common control signals.

In the present embodiment, a description will be given assuming a case where electrons are used as signal charges among electron-hole pairs generated in the photoelectric conversion element PD by light incidence. When electrons are used as the signal charges, each transistor included in the pixel 11 may be formed of an N-type MOS transistor. When each transistor is formed of an N-type MOS transistor, when a high-level control signal is supplied from the vertical scanning circuit 94, the corresponding transistor is turned on. When a low-level control signal is supplied from the vertical scanning circuit 94, the corresponding transistor is turned off. However, the signal charges are not limited to electrons, and holes may be used as the signal charges. When holes are used as signal charges, the conductivity type of each transistor is opposite to that described in this embodiment. The term "source" or "drain" of the MOS transistor may vary depending on the conductivity type of the transistor or the target function. Some or all of names of a source and a drain used in this embodiment are sometimes referred to as opposite names.

The photoelectric conversion element PD converts (photoelectrically converts) incident light into electric charges of an amount corresponding to the amount of the incident light. The transfer transistor M1 is turned on to transfer charges held in the photoelectric conversion element PD to the node FD. The charges transferred from the photoelectric conversion element PD are held in the capacitance (floating diffusion capacitance) of the node FD. As a result, the node FD has a potential corresponding to the amount of charge transferred from the photoelectric conversion element PD by the charge-to-voltage conversion by the floating diffusion capacitance.

The selection transistor M4 is turned on to connect the amplification transistor M3 to the vertical signal line 30. The amplification transistor M3 is configured such that a voltage VDD is supplied to the drain and a bias current is supplied from the current source 40 to the source via the selection transistor M4, and constitutes an amplifier circuit (source follower circuit) having a gate as an input node. Accordingly, the amplification transistor M3 outputs a signal based on the voltage of the node FD to the vertical signal line 30 through the selection transistor M4. In this sense, the amplification transistor M3 and the selection transistor M4 are an output unit that outputs a pixel signal corresponding to the amount of charge held in the node FD.

The reset transistor M2 has a function of controlling supply of a voltage (voltage VDD) for resetting the node FD serving as a charge holding portion to the node FD. The reset transistor M2 is turned on to reset the node FD to a voltage corresponding to the voltage VDD.

As described above, the pixel 11 can sequentially output the reset signal based on the state in which the potential of the node FD is reset by the reset transistor M2 and the photoelectric conversion signal which is a signal level based on the charges generated by the photoelectric conversion performed by the photoelectric conversion element PD.

The circuit configuration of the pixel 11 is not limited to the configuration illustrated in FIG. 2. For example, the selection transistor M4 may be connected between the power supply voltage node to which the voltage VDD is supplied and the amplification transistor M3. The circuit configuration illustrated in FIG. 2 is a so-called four-transistor type including the transfer transistor M1, the reset transistor M2, the amplification transistor M3, and the selection transistor M4, but the circuit configuration is not limited thereto. For example, the circuit configuration may be three-transistor type in which the selection transistor M4 may be omitted and the amplification transistor M3 may further function as a selection transistor. Further, the circuit configuration may be five-transistor type or more in which the number of transistors is larger than that illustrated in FIG. 2.

Figure 3:
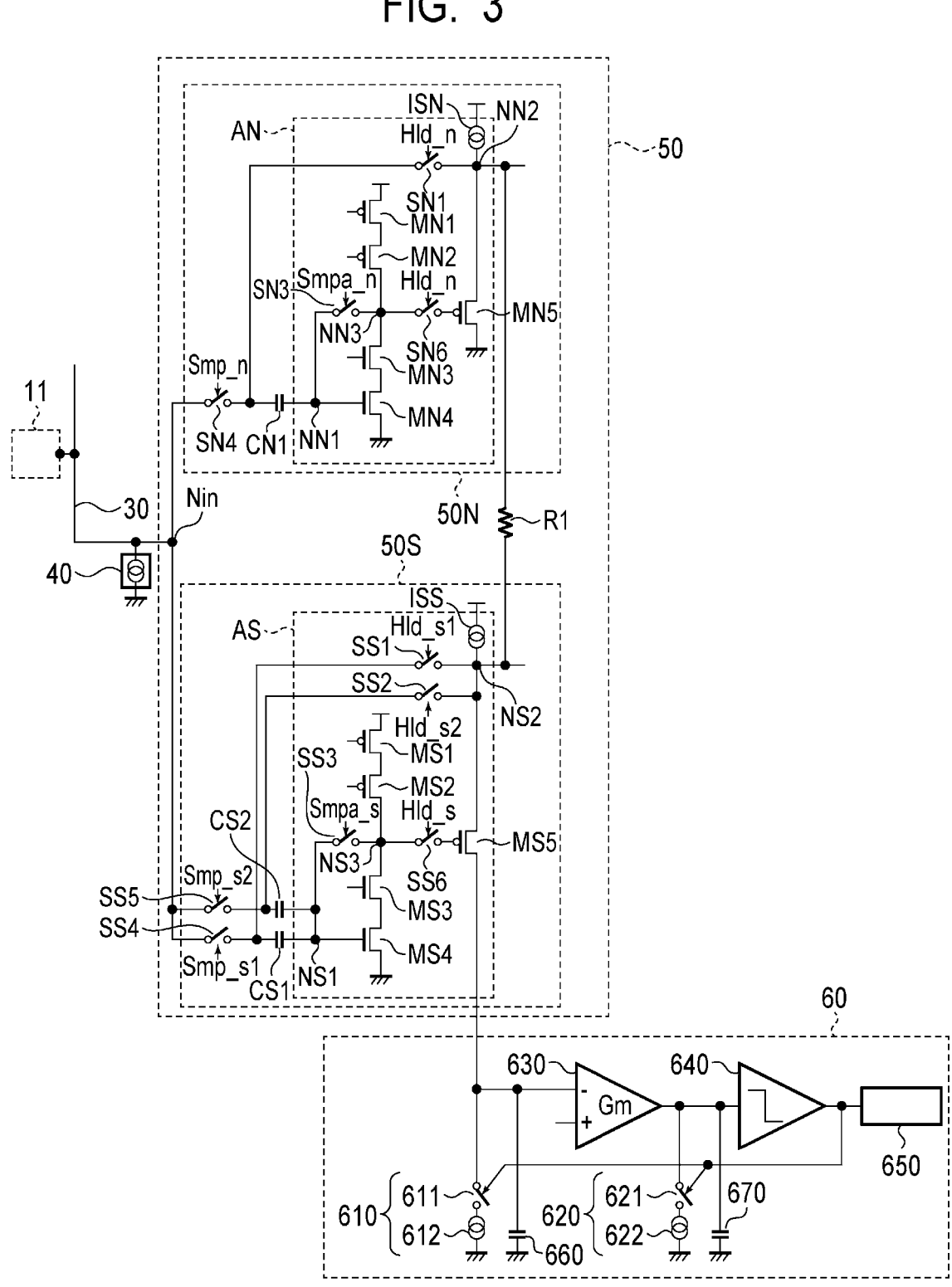
FIG. 3 is a circuit diagram illustrating a configuration of a sample-and-hold unit and a conversion unit according to the first embodiment.

FIG. 3 is a circuit diagram illustrating the configuration of the sample-and-hold unit 50 and the conversion unit 60 according to the present embodiment. FIG. 3 illustrates one sample-and-hold unit 50 and one conversion unit 60 arranged corresponding to one vertical signal line 30. The sample-and-hold unit 50 includes a sample-and-hold circuit 50N (second signal holding unit) that samples and holds the reset signal, a sample-and-hold circuit 50S (first signal holding unit) that samples and holds the photoelectric conversion signal, and a resistor element R1.

The sample-and-hold circuit 50S includes an inverting amplifier AS, capacitor elements CS1 and CS2, and switches SS4 and SS5. The inverting amplifier AS includes transistors MS1, MS2, MS3, MS4, and MS5, switches SS1, SS2, SS3, and SS6, and a current source ISS. The transistors MS1, MS2, and MS5 are P-type MOS transistors. The transistors MS3 and MS4 are N-type MOS transistors.

The switches SS1, SS2, SS3, SS4, SS5, and SS6 are controlled to be on or off in accordance with control signals input to these control terminals. The switches SS1, SS2, SS3, SS4, SS5, and SS6 may be formed of MOS transistors or the like. A control signal Hld_s1 is input from the control circuit 92 to the switch SS1. A control signal Hld_s2 is input from the control circuit 92 to the switch SS2. A control signal Smpa_s is input from the control circuit 92 to the switch SS3. A control signal Smp_s1 is input from the control circuit 92 to the switch SS4. A control signal Smp_s2 is input from the control circuit 92 to the switch SS5. A control signal Hld_s is input from the control circuit 92 to the switch SS6.

A first terminal of the switch SS4 (fourth switch) and a first terminal of the switch SS5 (fifth switch) are connected to a node Nin which is a connection node between the vertical signal line 30 and the sample-and-hold circuit 50S. A second terminal of the switch SS4 is connected to a first terminal of the capacitor element CS1 (first capacitor element) and a first terminal of the switch SS1 (first switch). A second terminal of the switch SS5 is connected to a first terminal of the capacitor element CS2 (second capacitor element) and a first terminal of the switch SS2 (second switch).

A second terminal of the capacitor element CS1 and a second terminal of the capacitor element CS2 are connected to a first terminal of the switch SS3 (third switch) and a gate of the transistor MS4 at a node NS1 that is an input terminal of the inverting amplifier AS. The source of the transistor MS4 is connected to a ground node. The drain of the transistor MS4 is connected to the source of the transistor MS3. The drain of the transistor MS3 is connected to a second terminal of the switch SS3, the drain of the transistor MS2, and a first terminal of the switch SS6 at a node NS3. The source of the transistor MS2 is connected to the drain of the transistor MS1. The source of the transistor MS1 is connected to a power supply voltage node. A predetermined bias potential is supplied to each of the gate of the transistor MS1, the gate of the transistor MS2, and the gate of the transistor MS3.

A second terminal of the switch SS1 and a second terminal of the switch SS2 are connected to the current source ISS and the source of the transistor MS5 at a node NS2 that is an output terminal of the inverting amplifier AS. The drain of the transistor MS5 is an output terminal of the sample-and-hold circuit 50S and the sample-and-hold unit 50, and is connected to the conversion unit 60.

The transistors MS1, MS2, MS3, and MS4 form a common source circuit having the node NS1 as an input node and the node NS3 as an output node. The transistor MS5 forms a source follower circuit. That is, the inverting amplifier AS includes, as an amplifier circuit, a common source circuit and a source follower circuit arranged at a subsequent stage of the common source circuit.

The sample-and-hold circuit 50N includes an inverting amplifier AN, a capacitor element CN1, and a switch SN4. The inverting amplifier AN includes transistors MN1, MN2, MN3, MN4, and MN5, switches SN1, SN3, and SN6, and a current source ISN. The transistors MN1, MN2, and MN5 are P-type MOS transistors. The transistors MN3 and MN4 are N-type MOS transistors.

The switches SN1, SN3, SN4, and SN6 are controlled to be on or off in accordance with control signals input to these control terminals. The switches SN1, SN3, SN4, and SN6 may be formed of MOS transistors or the like. A control signal Hld_n is input from the control circuit 92 to the switches SN1 and SN6. A control signal Smpa_n is input from the control circuit 92 to the switch SN3. A control signal Smp_n is input from the control circuit 92 to the switch SN4.

A first terminal of the switch SN4 is connected to the node Nin which is the connection node between the vertical signal line 30 and the sample-and-hold circuit 50N. A second terminal of the switch SN4 is connected to a first terminal of the capacitor element CN1 and a first terminal of the switch SN1.

A second terminal of the capacitor element CN1 is connected to a first terminal of the switch SN3 and a gate of the transistor MN4 at a node NN1 that is an input terminal of the inverting amplifier AN. The source of the transistor MN4 is connected to a ground node. The drain of the transistor MN4 is connected to the source of the transistor MN3. The drain of the transistor MN3 is connected to a second terminal of the switch SN3, the drain of the transistor MN2, and a first terminal of the switch SN6 at a node NN3. The source of the transistor MN2 is connected to the drain of the transistor MN1. The source of the transistor MN1 is connected to a power supply voltage node. A predetermined bias potential is supplied to each of the gate of the transistor MN1, the gate of the transistor MN2, and the gate of the transistor MN3.

A second terminal of the switch SN1 is connected to the current source ISN and the source of the transistor MN5 at a node NN2 that is an output terminal of the inverting amplifier AN. The drain of the transistor MN5 is connected to a ground node.

The transistors MN1, MN2, MN3, and MN4 form a common source circuit having the node NN1 as an input node and the node NN3 as an output node. The transistor MN5 forms a source follower circuit. That is, the inverting amplifier AN includes, as an amplifier circuit, a common source circuit and a source follower circuit arranged at a subsequent stage of the common source circuit.

A first terminal of the resistor element R1 is connected to the node NN2, and a second terminal of the resistor element R1 is connected to the node NS2. That is, the resistor element R1 is arranged between the output terminal of the inverting amplifier AN and the output terminal of the inverting amplifier AS. Here, a current I flowing through the resistor element R1 is represented by the following expression (1).

$$I=(Vn-Vs)/R \tag{1}$$

Here, Vn denotes a potential of the node NN2, that is, a potential of the reset signal. Vs denotes a potential of the node NS2, that is, a potential of the photoelectric conversion signal. R denotes a resistance value of the resistor element R1.

The current I flowing through the sample-and-hold circuits 50N and 50S and the resistor element R1 is input to the conversion unit 60 (analog-to-digital conversion unit). As represented in the expression (1), the current I is proportional to the difference between the potential Vn of the reset signal and the potential Vs of the photoelectric conversion signal. Therefore, the correlated double sampling is performed at the stage where the current I is input to the conversion unit 60. The circuit element arranged between the node NN2 and the node NS2 is not limited to the resistor element R1, and may be any element as long as a current can flow according to the potential difference between Vn and Vs.

The conversion unit 60 includes digital-to-analog converter 610 and 620, a Gm cell 630, a quantizer 640, a decimation filter 650, and capacitor elements 660 and 670. The digital-to-analog converter 610 includes a switch 611 and a current source 612. The digital-to-analog converter 620 includes a switch 621 and a current source 622. A signal fed back from the quantizer 640 is input to the control terminal of the switch 611 and the control terminal of the switch 621. The switch 611 and the switch 621 are controlled to be on or off in accordance with this signal.

The drain of the transistor MS5 is connected to a first terminal of the switch 611, a first terminal of the capacitor element 660, and an inverting input terminal of the Gm cell 630. That is, the current I after the processing by the correlated double sampling output from the sample-and-hold circuit 50S is input to the conversion unit 60. A second terminal of the switch 611 is connected to the current source 612. A second terminal of the capacitor element 660 is connected to a ground node. A predetermined potential is input to a non-inverting input terminal of the Gm cell 630.

An output terminal of the Gm cell 630 is connected to a first terminal of the switch 621, a first terminal of the capacitor element 670, and an input terminal of the quantizer 640. A second terminal of the switch 621 is connected to the current source 622. A second terminal of the capacitor element 670 is connected to a ground node. An output terminal of the quantizer 640 is connected to an input terminal of the decimation filter 650, a control terminal of the switch 611, and a control terminal of the switch 621.

Charges are accumulated in the capacitor element 660 in accordance with the current I and the passage of time. The Gm cell 630 outputs a current signal according to the potential of the first terminal of the capacitor element 660 from the output terminal. In this manner, the capacitor element 660 functions as a first integrator.

Charges are accumulated in the capacitor element 670 in accordance with the current output from the Gm cell 630 and the passage of time. In this manner, the capacitor element 670 functions as a second integrator. The quantizer 640 may be a comparison circuit. The quantizer 640 compares the potential of the first terminal of the capacitor element 670 with a predetermined threshold value, and outputs a 1-bit digital signal indicating the comparison result. Thus, the quantizer 640 performs analog-to-digital conversion. Note that, the quantizer 640 performs oversampling at a frequency higher than a desired sampling frequency.

The digital signal output from the quantizer 640 is fed back to the control terminals of the switch 611 and the switch 621. Accordingly, the switches 611 and 621 are controlled to be on or off, whereby charges stored in the capacitor elements 660 and 670 are changed. In this way, the digital signal output from the quantizer 640 is fed back to the first integrator and the second integrator. This feedback loop operates to reduce quantization errors in the low-frequency domain.

As described above, the conversion unit 60 of the present embodiment is a delta-sigma analog-to-digital conversion circuit having second-order noise shaping characteristics by including two integrators. The digital signal output from the quantizer 640 passes through the decimation filter 650 and is output. The decimation filter 650 reduces the sampling frequency by decimating the signal output from the quantizer 640. This reduces noise in the high-frequency domain. Therefore, the conversion unit 60 of the present embodiment can perform high-precision analog-to-digital conversion.

Figure 4:
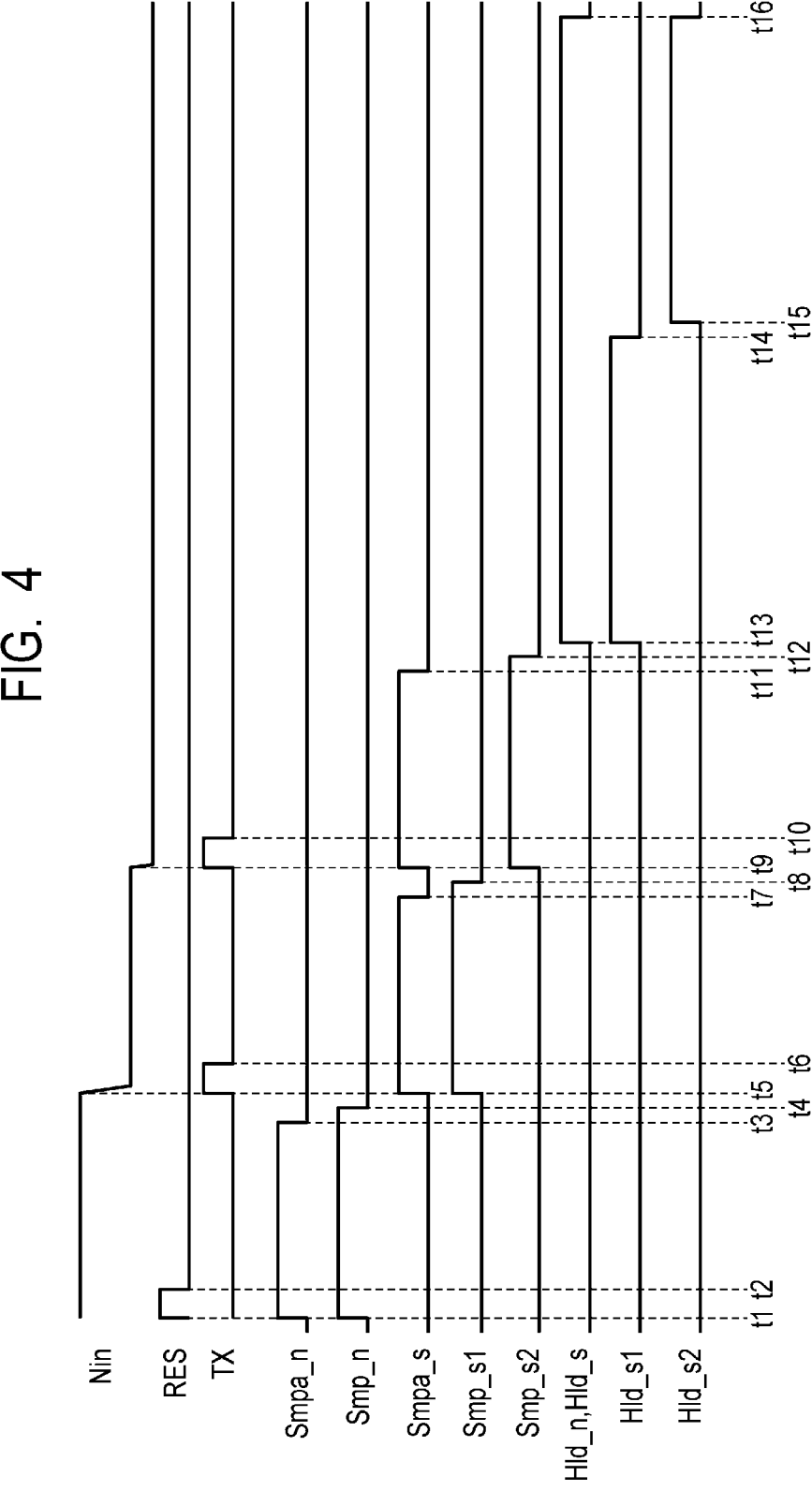
FIG. 4 is a timing chart illustrating an operation of the photoelectric conversion device according to the first embodiment.

FIG. 4 is a timing chart illustrating an operation of the photoelectric conversion device according to the present embodiment. FIG. 4 illustrates potential levels of the control signals RES and TX input to the pixels 11. FIG. 4 also illustrates the potential levels of the control signals Smpa_n, Smp_n, Smpa_s, Smp_s1, Smp_s2, Hld_n, Hld_s, Hld_s1, and Hld_s2 input to the sample-and-hold unit 50. Note that since the change timings of the potential levels of the control signals Hld_n and Hld_s are the same, the control signals Hld_n and Hld_s are collectively illustrated in FIG. 4. FIG. 4 also illustrates a change in potential at the node Nin. When each control signal in FIG. 4 is at the high level, the corresponding switch or transistor is turned on (conductive state). When each control signal in FIG. 4 is at the low level, the corresponding switch or transistor is turned off (non-conductive state).

At time t1, the control signal RES becomes the high level, and at time t2, the control signal RES becomes the low level. By these operations, in a period from the time t1 to the time t2, the reset transistor M2 is turned on, and the potential of the node FD is reset. In response to this operation, the potential of the node Nin becomes the level of the reset signal.

At the time t1, the control signals Smpa_n and Smp_n become the high level. As a result, the switches SN3 and SN4 are turned on, and the vertical signal line 30 is connected to the capacitor element CN1 of the sample-and-hold circuit 50N. Thereafter, the sample-and-hold circuit 50N enters a state in which sampling of the reset signal can be performed.

At time t3, the control signal Smpa_n becomes the low level. Accordingly, the switch SN3 is turned off, and the potential of the reset signal is held in the capacitor element CN1. At time t4, the control signal Smp_n becomes the low level. As a result, the switch SN4 is turned off, and the vertical signal line 30 and the capacitor element CN1 of the sample-and-hold circuit 50N are disconnected.

At time t5, the control signal TX becomes the high level, and at time t6, the control signal TX becomes the low level. By these operations, in a period from the time t5 to the time t6, the transfer transistor M1 is turned on, and the charges accumulated in the photoelectric conversion element PD is transferred to the node FD. The potential of the node FD decreases in accordance with the amount of transferred charge. By this charge transfer, the potential of the vertical signal line 30 decreases, and the potential of the node Nin becomes a level of a first photoelectric conversion signal.

At the time t5, the control signals Smpa_s and Smp_s1 become the high level. As a result, the switches SS3 and SS4 are turned on, and the vertical signal line 30 is connected to the capacitor element CS1 of the sample-and-hold circuit 50S. Thereafter, the sample-and-hold circuit 50S enters a state in which sampling of the first photoelectric conversion signal can be performed.

At time t7, the control signal Smpa_s becomes the low level. As a result, the switch SS3 is turned off, and the potential of the first photoelectric conversion signal is held in the capacitor element CS1. At time t8, the control signal Smp_s1 becomes the low level. As a result, the switch SS4 is turned off, and the vertical signal line 30 and the capacitor element CS1 of the sample-and-hold circuit 50S are disconnected.

At time t9, the control signal TX becomes the high level, and at time t10, the control signal TX becomes the low level. By these operations, in a period from the time t9 to the time t10, the transfer transistor M1 is turned on again, and the charges accumulated in the photoelectric conversion element PD during a period from the time t6 to the time t10 is further transferred to the node FD. The potential of the node FD further decreases according to the amount of transferred charge. By this charge transfer, the potential of the vertical signal line 30 decreases, and the potential of the node Nin becomes a level of a second photoelectric conversion signal. Since the charge accumulation times are different from each other, the potential of the first photoelectric conversion signal and the potential of the second photoelectric conversion signal are different from each other.

At the time t9, the control signals Smpa_s and Smp_s2 become the high level. As a result, the switches SS3 and SS5 are turned on, and the vertical signal line 30 is connected to the capacitor element CS2 of the sample-and-hold circuit 50S. Thereafter, the sample-and-hold circuit 50S enters a state in which sampling of the second photoelectric conversion signal can be performed.

At time t11, the control signal Smpa_s becomes the low level. As a result, the switch SS3 is turned off, and the potential of the second photoelectric conversion signal is held in the capacitor element CS2. At time t12, the control signal Smp_s2 becomes the low level. As a result, the switch SS5 is turned off, and the vertical signal line 30 and the capacitor element CS2 of the sample-and-hold circuit 50S are disconnected.

At time t13, the control signal Hld_n becomes the high level. As a result, the switches SN6 and SN1 are turned on, and the potential of the reset signal is output from the node NN2 of the sample-and-hold circuit 50N. At the same time, at the time t13, the control signals Hld_s and Hld_s1 become the high level. As a result, the switches SS6 and SS1 are turned on, and the potential of the first photoelectric conversion signal is output from the node NS2 of the sample-and-hold circuit 50S. Then, at time t14, the control signal Hld_s1 becomes the low level, and the switch SS1 is turned off.

Therefore, in a period from the time t13 to the time t14, a current corresponding to the difference between the potential of the reset signal of the node NN2 and the potential of the first photoelectric conversion signal of the node NS2 is input to the conversion unit 60. The conversion unit 60 converts an analog signal based on the current into a digital signal.

At time t15, the control signal Hld_s2 becomes the high level. As a result, the switch SS2 is turned on, and the potential of the second photoelectric conversion signal is output from the node NS2 of the sample-and-hold circuit 50S. Thereafter, at time t16, the control signals Hld_n, Hld_s, and Hld_s2 become the low level, and the switches SN6, SN1, SS6, and SS2 are turned off.

Therefore, from the time t15 to the time t16, a current corresponding to the difference between the potential of the reset signal of the node NN2 and the potential of the second photoelectric conversion signal of the node NS2 is input to the conversion unit 60. The conversion unit 60 converts an analog signal based on the current into a digital signal.

As described above, the photoelectric conversion device of the present embodiment can read out two digital signals based on the first photoelectric conversion signals and the second photoelectric conversion signals having different accumulation times. The two digital signals can be applied to higher functionality of imaging such as high dynamic range.

The effect of the present embodiment will be described in more detail. Generally, when a switch is turned off, charges may be injected from a transistor or the like included in a switch to a node connected to the switch. When the switch SS3 is turned off at the time t7, the influence of charge injection may occur on the first photoelectric conversion signal accumulated in the capacitor element CS1. When the switch SS3 is turned off at the time t11, the influence of charge injection may occur on the second photoelectric conversion signal accumulated in the capacitor element CS2. However, at both timings of the time t7 and the time t11, since the voltage across the switch SS3 is substantially the same regardless of the potential of the vertical signal line 30, the charge injection amount is approximately the same. Thus, when the first photoelectric conversion signal and the second photoelectric conversion signal are compared, the relative error of the gain component between them is small.

When the switch SS4 is turned off at the time t8, since both terminals of the capacitor element CS1 are in the high impedance state, the influence of charge injection due to the switch SS4 being turned off is small. Similarly, when the switch SS5 is turned off at the time t12, since both terminals of the capacitor element CS2 are in the high impedance state, the influence of charge injection due to the switch SS5 being turned off is small. In the period in which the signals are held in the capacitor elements CS1 and CS2, since the switches SS4 and SS5 are turned off before the switch SS3, the influence of charge injection when the switches SS4 and SS5 are turned off is reduced.

As described above, in the circuit configuration of the sample-and-hold circuits 50N and 50S of the present embodiment, the relative error of the gain component due to charge injection from the switch when two output signals are output is reduced. Thus, according to the present embodiment, the photoelectric conversion device in which the accuracy of the output signal is improved is provided.

The two signals output from the photoelectric conversion device of the present embodiment with different charge accumulation times can be used for high dynamic range imaging. In the present embodiment, since the relative error of the gain components of these two signals can be reduced, the image quality of the HDR image may be improved.

Second Embodiment

The photoelectric conversion device according to the present embodiment will be described. The photoelectric conversion device of the present embodiment is an example in which the configuration of the sample-and-hold unit 50 of the photoelectric conversion device of the first embodiment is modified.

Figure 5:
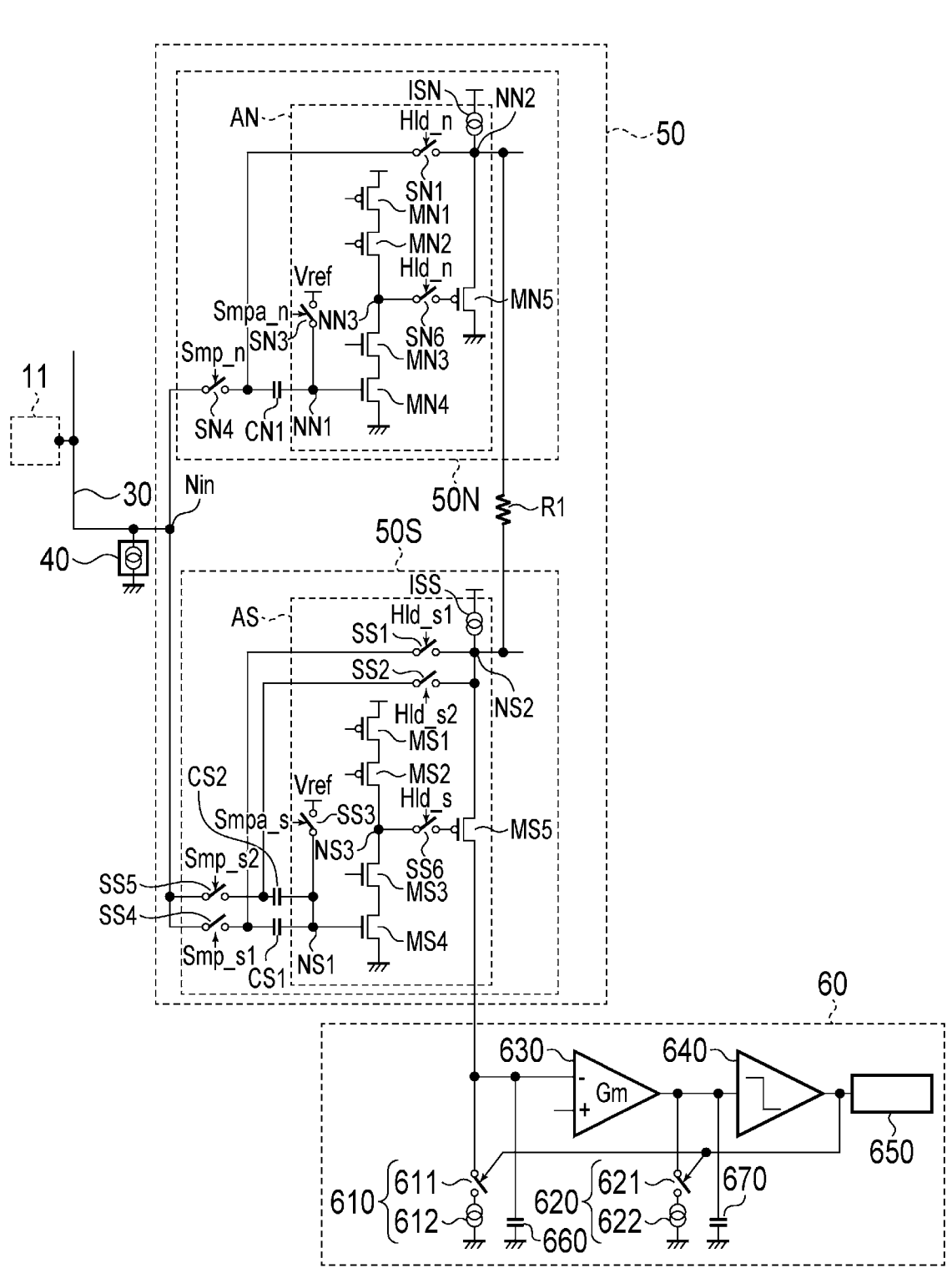
FIG. 5 is a circuit diagram illustrating a configuration of a sample-and-hold unit and a conversion unit according to a second embodiment.

FIG. 5 is a circuit diagram illustrating the configuration of the sample-and-hold unit 50 and the conversion unit 60 according to the present embodiment. As illustrated in FIG. 5, in the present embodiment, the connection of the switches SS3 and SN3 is different from the example illustrated in FIG. 3.

The first terminal of the switch SS3 is connected to the node NS1. The second terminal of the switch SS3 is connected to a reference voltage node to which a predetermined reference voltage Vref is supplied, and is not connected to the node NS3.

The first terminal of the switch SN3 is connected to the node NN1. The second terminal of the switch SN3 is connected to a reference voltage node to which a predetermined reference voltage Vref is supplied, and is not connected to the node NN3.

Thus, in the present embodiment, unlike the example of FIG. 3 of the first embodiment, a predetermined reference voltage is supplied to the second terminals of the switches SS3 and SN3. Also in this case, the voltages across the switches SS3 and SN3 are substantially the same regardless of the potential of the vertical signal line 30 at both timings of the time t7 and the time t11. Therefore, as in the example of FIG. 3, the relative error of the gain component due to charge injection from the switch when two output signals are output is reduced. Therefore, also in the present embodiment, similarly to the first embodiment, the photoelectric conversion device in which the accuracy of the output signal is improved is provided.

Third Embodiment

The photoelectric conversion device according to the present embodiment will be described. The photoelectric conversion device of the present embodiment is an example in which the configuration of the pixel 11 of the photoelectric conversion device of the first embodiment is modified.

Figure 6:
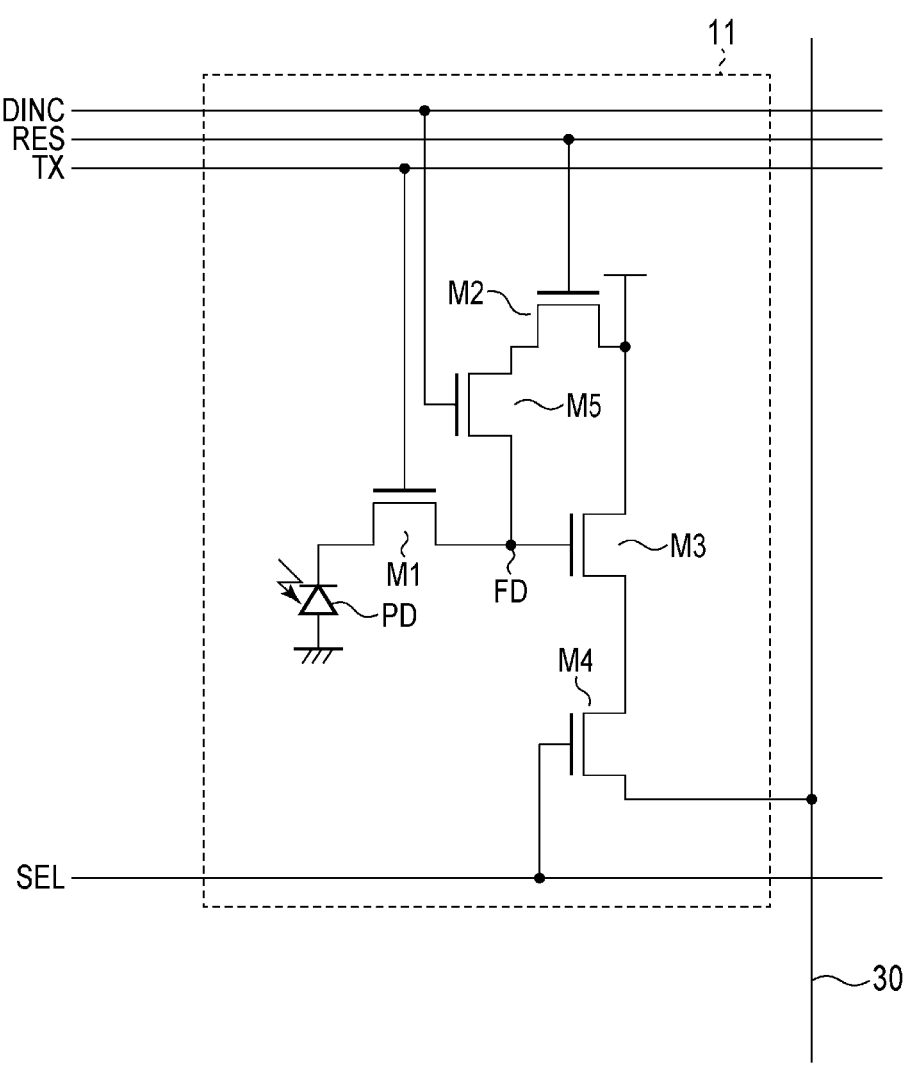
FIG. 6 is a circuit diagram of a pixel according to a third embodiment.

FIG. 6 is a circuit diagram of the pixel 11 according to the present embodiment. As illustrated in FIG. 6, in the present embodiment, the capacitance control transistor M5 is added to the circuit of the pixel 11 illustrated in FIG. 2 of the first embodiment.

The source of the capacitance control transistor M5 is connected to the node FD, and the drain of the capacitance control transistor M5 is connected to the source of the reset transistor M2. The control line of each row includes a signal line connected to the gate of the capacitance control transistor M5. A control signal FDINC is supplied from the vertical scanning circuit 94 to the gate of the capacitance control transistor M5. When the control signal FDINC becomes the high level and the capacitance control transistor M5 is turned on, parasitic capacitance added to the node FD increases. This reduces the gain of charge-to-voltage conversion at the node FD. As described above, the pixel 11 of the present embodiment has a function of varying the gain of charge-to-voltage conversion according to the control signal FDINC.

Thus, in the present embodiment, the gain of the charge-to-voltage conversion at the time of reading the first photoelectric conversion signal and the gain of the charge-to-voltage conversion at the time of reading the second photoelectric conversion signal can be made different from each other. For example, in the timing chart of FIG. 4, the control signal FDINC is set to the low level in a period before the time t9, and the control signal FDINC is set to the high level in a period after the time t9, whereby such a driving method is realized. Alternatively, the control signal FDINC may be set to the high level in the period before the time t9, and the control signal FDINC may be set to the low level in the period after the time t9.

As described above, according to the present embodiment, in addition to providing the photoelectric conversion device in which the accuracy of the output signal is improved as in the first embodiment, the gain of the charge-to-voltage conversion in the pixel 11 can be made variable. Thereby, two digital signals read at different gains can be read out. The two digital signals can be applied to higher functionality of imaging such as high dynamic range.

Fourth Embodiment

The photoelectric conversion device according to the present embodiment will be described. The photoelectric conversion device of the present embodiment is an example in which the configuration of the sample-and-hold unit 50 of the photoelectric conversion device of the first embodiment is modified.

Figure 7:
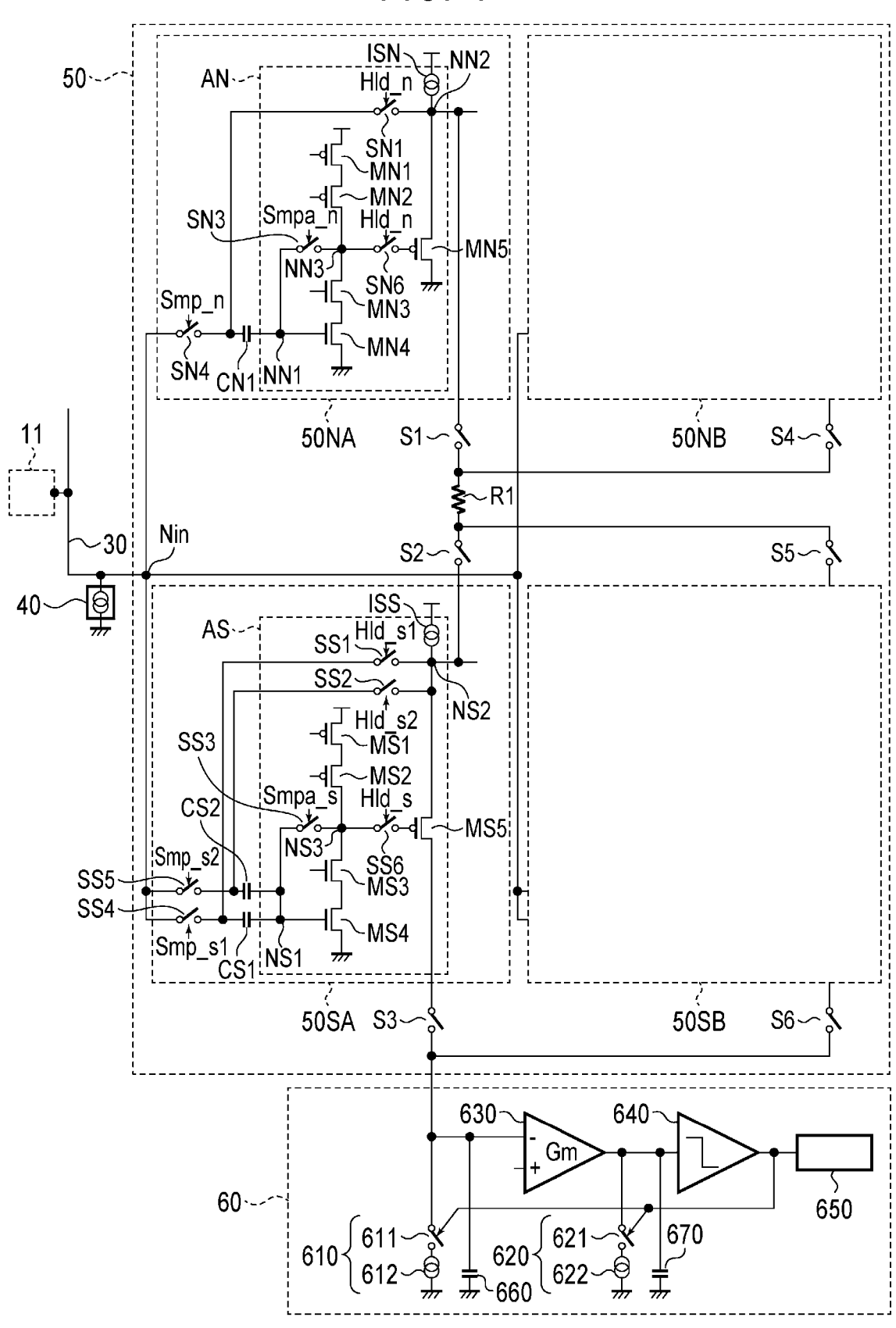
FIG. 7 is a circuit diagram illustrating a configuration of a sample-and-hold unit and a conversion unit according to a fourth embodiment.

FIG. 7 is a circuit diagram illustrating the configuration of the sample-and-hold unit 50 and the conversion unit 60 according to the present embodiment. As illustrated in FIG. 7, in the present embodiment, the sample-and-hold unit 50 includes four sample-and-hold circuits 50NA, 50SA, 50NB, and 50SB. The sample-and-hold unit 50 further includes a resistor element R1 and switches S1, S2, S3, S4, S5, and S6. The switches S1, S2, S3, S4, S5, and S6 may be formed of MOS transistors or the like. The switches S1, S2, S3, S4, S5, and S6 are controlled to be on or off by a control signal input from the control circuit 92.

The internal circuit configuration of the sample-and-hold circuits 50NA and 50NB is the same as that of the sample-and-hold circuit 50N in FIG. 3. The internal circuit configuration of the sample-and-hold circuits 50SA and 50SB is the same as that of the sample-and-hold circuit 50S in FIG. 3.

In the sample-and-hold circuit 50SA and the sample-and-hold circuit 50SB, the first terminal of the switch SS4 and the first terminal of the switch SS5 are connected to the node Nin. In the sample-and-hold circuit 50NA and the sample-and-hold circuit 50NB, the first terminal of the switch SN4 is connected to the node Nin.

A first terminal of the switch S1 is connected to the node NN2 of the sample-and-hold circuit 50NA, and a first terminal of the switch S4 is connected to the node NN2 of the sample-and-hold circuit 50NB. A second terminal of the switch S1 and a second terminal of the switch S4 are connected to a first terminal of the resistor element R1. A second terminal of the resistor element R1 is connected to a first terminal of the switch S2 and a first terminal of the switch S5. A second terminal of the switch S2 is connected to the node NS2 of the sample-and-hold circuit 50SA, and a second terminal of the switch S5 is connected to the node NS2 of the sample-and-hold circuit 50SB.

A first terminal of the switch S3 is connected to the drain of the transistor MS5 of the sample-and-hold circuit 50SA. A first terminal of the switch S6 is connected to the drain of the transistor MS5 of the sample-and-hold circuit 50SB. A second terminal of the switch S3 and a second terminal of the switch S6 are an output terminal of the sample-and-hold unit 50 and are connected to the conversion unit 60.

When the switches S1, S2, and S3 are turned on and the switches S4, S5, and S6 are turned off, the sample-and-hold circuit 50NA and the sample-and-hold circuit 50SA are connected to the resistor element R1 and the conversion unit 60. At this time, the conversion unit 60 can perform AD conversion based on the signals held in the sample-and-hold circuit 50NA and the sample-and-hold circuit 50SA. In parallel with this, the sample-and-hold circuit 50NB and the sample-and-hold circuit 50SB can sample a signal from the pixel 11 by operating these internal switches as described in the first embodiment.

When the switches S4, S5, and S6 are turned on and the switches S1, S2, and S3 are turned off, the sample-and-hold circuit 50NB and the sample-and-hold circuit 50SB are connected to the resistor element R1 and the conversion unit 60. At this time, the conversion unit 60 can perform AD conversion based on the signals held in the sample-and-hold circuit 50NB and the sample-and-hold circuit 50SB. In parallel with this, the sample-and-hold circuit 50NA and the sample-and-hold circuit 50SA can sample a signal from the pixel 11 by operating these internal switches as described in the first embodiment.

As described above, in the present embodiment, it is possible to perform an operation in which one of the sample-and-hold circuits 50NA and 50SA and the sample-and-hold circuits 50NB and 50SB is selectively connected to the resistor element R1. Further, in the present embodiment, one of the sample-and-hold circuits 50NA and 50SA and the sample-and-hold circuits 50NB and 50SB is selectively connected to the vertical signal line 30, and sampling can be performed. Thus, an interleave operation is performed such that one of the sample-and-hold circuits 50NA and 50SA and the sample-and-hold circuits 50NB and 50SB performs sampling while the other outputs a signal to the conversion unit 60. For example, in the timing chart of FIG. 4, control is performed such that the switches S1, S2, and S3 are turned on and the switches S4, S5, and S6 are turned off during a period from the time t13 to the time t16. In this case, a signal can be output from the sample-and-hold circuits 50NA and 50SA to the conversion unit 60 while sampling is performed by the sample-and-hold circuits 50NB and 50SB.

As described above, according to the present embodiment, in addition to providing the photoelectric conversion device in which the accuracy of the output signal is improved as in the first embodiment, the reading speed can be increased by performing the interleave operation. Also, as illustrated in FIG. 7, the sample-and-hold circuits 50NA and 50SA and the sample-and-hold circuits 50NB and 50SB share one resistor element R1. This makes it possible to reduce the read gain difference between the case where the sample-and-hold circuits 50NA and 50SA output the signals and the case where the sample-and-hold circuits 50NB and 50SB output the signals.

Fifth Embodiment

The photoelectric conversion device according to the present embodiment will be described. The photoelectric conversion device of the present embodiment is an example in which the configuration of the pixel 11 of the photoelectric conversion device of the first embodiment is modified to include a plurality of photoelectric conversion elements.

Figure 8:
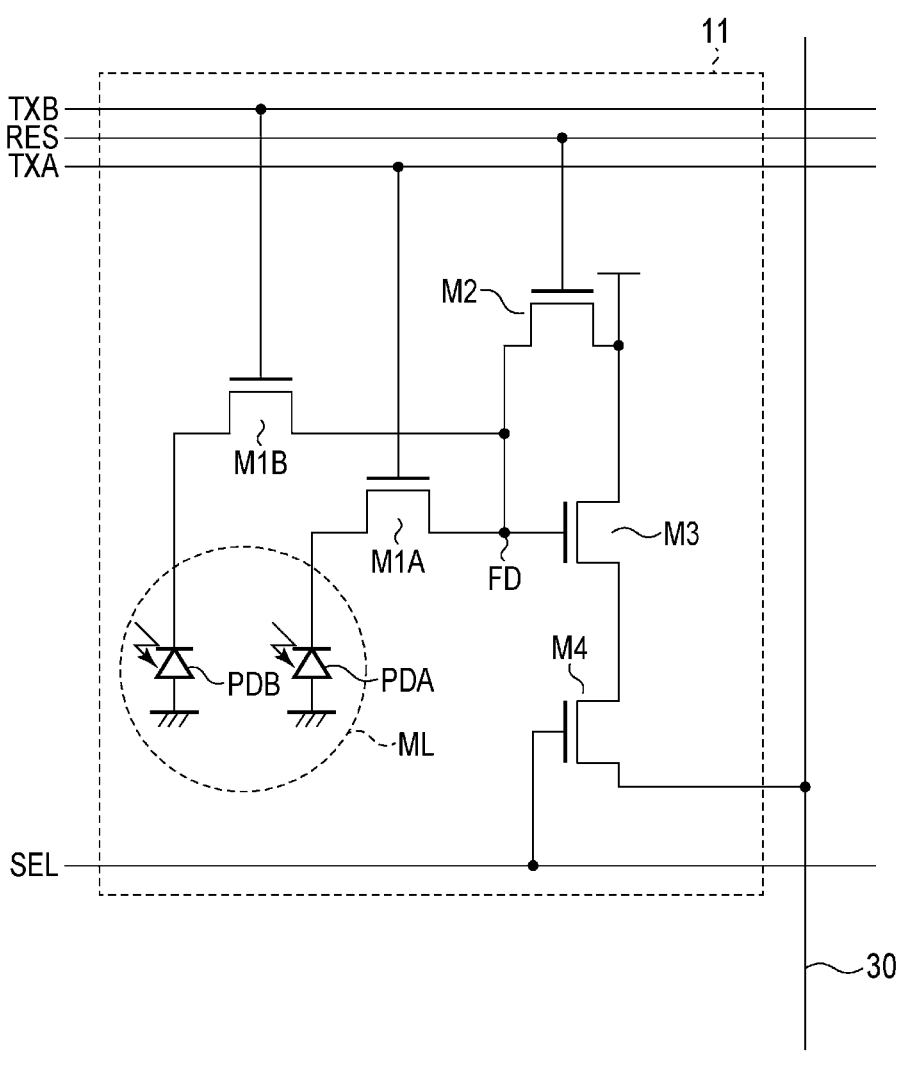
FIG. 8 is a circuit diagram of a pixel according to a fifth embodiment.

FIG. 8 is a circuit diagram of the pixel 11 according to the present embodiment. As illustrated in FIG. 8, in the present embodiment, the pixel 11 includes two photoelectric conversion elements PDA and PDB and two transfer transistors M1A and M1B.

The anodes of the photoelectric conversion elements PDA and PDB are connected to a ground node. The cathode of the photoelectric conversion element PDA is connected to the source of the transfer transistor M1A, and the cathode of the photoelectric conversion element PDB is connected to the source of the transfer transistor M1B. The drains of the transfer transistors M1A and M1B are connected to the node FD. The control line of each row includes a signal line connected to the gate of the transfer transistor M1A and a signal line connected to the gate of the transfer transistor M1B. A control signal TXA is supplied from the vertical scanning circuit 94 to the gate of the transfer transistor M1A, and a control signal TXB is supplied from the vertical scanning circuit 94 to the gate of the transfer transistor M1B. As described above, in the present embodiment, the two photoelectric conversion elements PDA and PDB share one floating diffusion portion.

Figure 9:
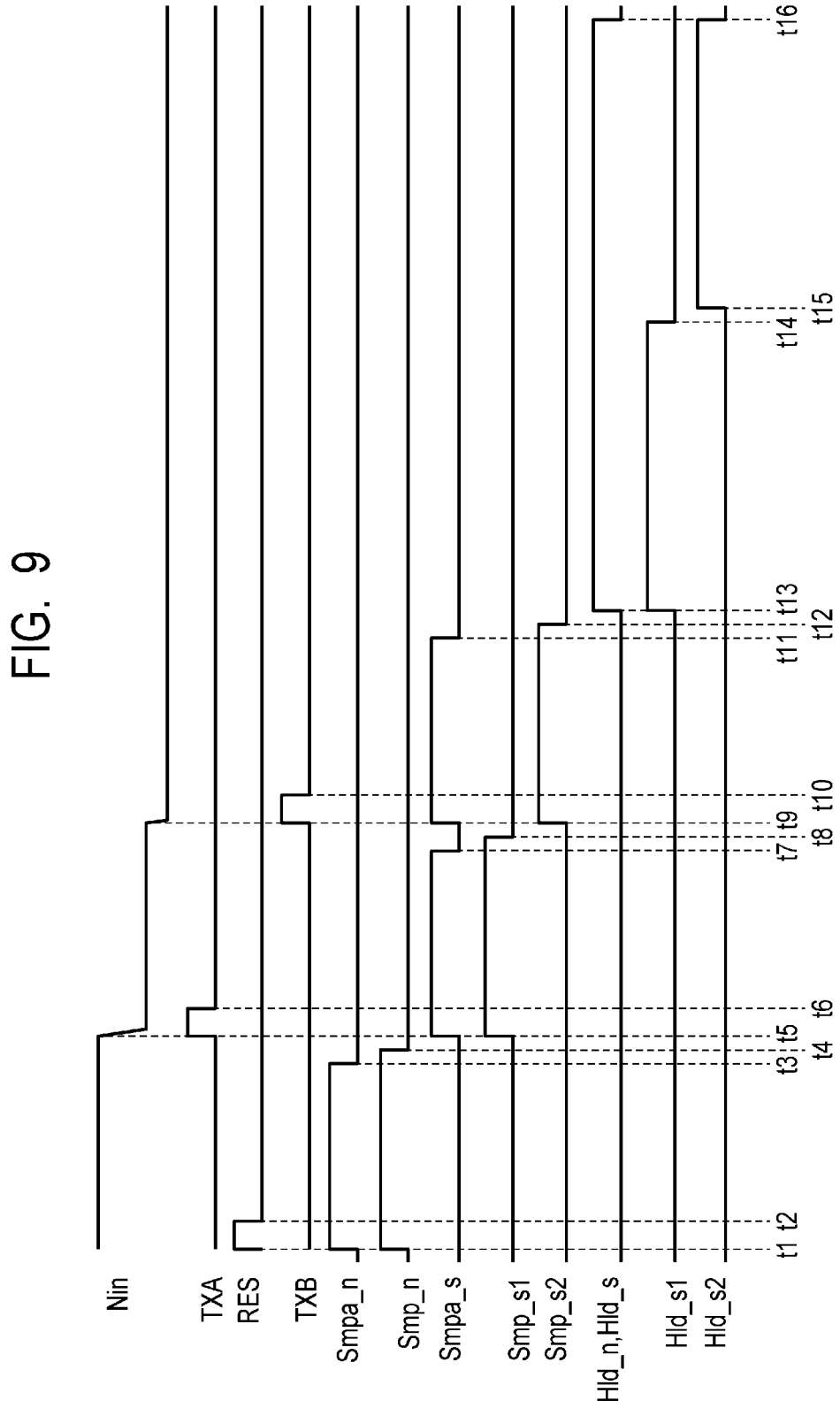
FIG. 9 is a timing chart illustrating an operation of a photoelectric conversion device according to the fifth embodiment.

FIG. 9 is a timing chart illustrating an operation of the photoelectric conversion device according to the present embodiment. FIG. 9 illustrates potential levels of the control signals TXA and TXB instead of the control signal TX in the timing chart of FIG. 4. Since the timings of the control signals other than the control signals TXA and TXB are the same as those in FIG. 4, the description thereof will be omitted or simplified as appropriate.

At the time t5, the control signal TXA becomes the high level, and at the time t6, the control signal TXA becomes the low level. By these operations, in the period from the time t5 to the time t6, the transfer transistor M1A is turned on, and the charges accumulated in the photoelectric conversion element PDA is transferred to the node FD. The potential of the node FD decreases in accordance with the amount of transferred charge. By this charge transfer, the potential of the vertical signal line 30 decreases, and the potential of the node Nin becomes a level of a first photoelectric conversion signal based on the charges accumulated in the photoelectric conversion element PDA.

From the time t5 to the time t8, the potential of the first photoelectric conversion signal based on the charges accumulated in the photoelectric conversion element PDA is held in the capacitor element CS1 by the same operation as in FIG. 4.

At the time t9, the control signal TXB becomes the high level, and at the time t10, the control signal TXB becomes the low level. By these operations, in the period from the time t9 to the time t10, the transfer transistor M1B is turned on, and the charges accumulated in the photoelectric conversion element PDB is further transferred to the node FD. The potential of the node FD decreases in accordance with the amount of transferred charge. By this charge transfer, the potential of the vertical signal line 30 decreases, and the potential of the node Nin becomes a level of a second photoelectric conversion signal based on the sum of the charges accumulated in the photoelectric conversion element PDA and the charges accumulated in the photoelectric conversion element PDB.

From the time t9 to the time t12, by the same operation as in FIG. 4, the potential of the second photoelectric conversion signal based on the charges accumulated in the photoelectric conversion elements PDA and PDB is held in the capacitor element CS2.

After the time t13, two digital signals based on the first photoelectric conversion signals and two second photoelectric conversion signals are read out by the same operation as in FIG. 4. The digital signals acquired here are two digital signals including a digital signal based on charges accumulated in the photoelectric conversion element PDA and a digital signal based on charges accumulated in the photoelectric conversion element PDA and the photoelectric conversion element PDB. By calculating the difference between the two digital signals in the data processing unit 90, a signal processing circuit outside the photoelectric conversion device, or the like, it is possible to acquire a digital signal based on the charges accumulated in the photoelectric conversion element PDB.

As described above, according to the present embodiment, in addition to providing the photoelectric conversion device in which the accuracy of the output signal is improved as in the first embodiment, two kinds of signals based on the two photoelectric conversion elements PDA and PDB can be collectively output. This speeds up the reading operation.

As schematically illustrated in FIG. 8, the two photoelectric conversion elements PDA and PDB may be arranged such that light passing through the same microlens ML is incident on those. In this case, signals based on corresponding two photoelectric conversion elements PDA and PDB can be used as signals for autofocus. However, the present embodiment is not limited thereto, and individual microlenses ML may be arranged for each of the two photoelectric conversion elements PDA and PDB.

Further, in the present embodiment, the configuration of the sample-and-hold unit 50 having the four sample-and-hold circuits 50NA, 50SA, 50NB, and 50SB as in the fourth embodiment may be applied. As a result, the interleave operation can be performed similarly to the fourth embodiment, and the speed of the reading operation is further increased.

Although the pixel 11 has two photoelectric conversion elements PDA and PDB in the present embodiment, the number of photoelectric conversion elements may be greater than two. For example, the number of photoelectric conversion elements may be four or eight. When the number of photoelectric conversion elements is four, examples of the two-dimensional arrangement of the photoelectric conversion elements include 1×4 and 2×2. When the number of photoelectric conversion elements is eight, examples of the two-dimensional arrangement of the photoelectric conversion elements include 1×8 and 2×4.

Sixth Embodiment

The photoelectric conversion device according to the present embodiment will be described. The photoelectric conversion device of the present embodiment is an example in which a multiplexer for selecting a vertical signal line is added to the photoelectric conversion device of the first embodiment.

Figure 10:
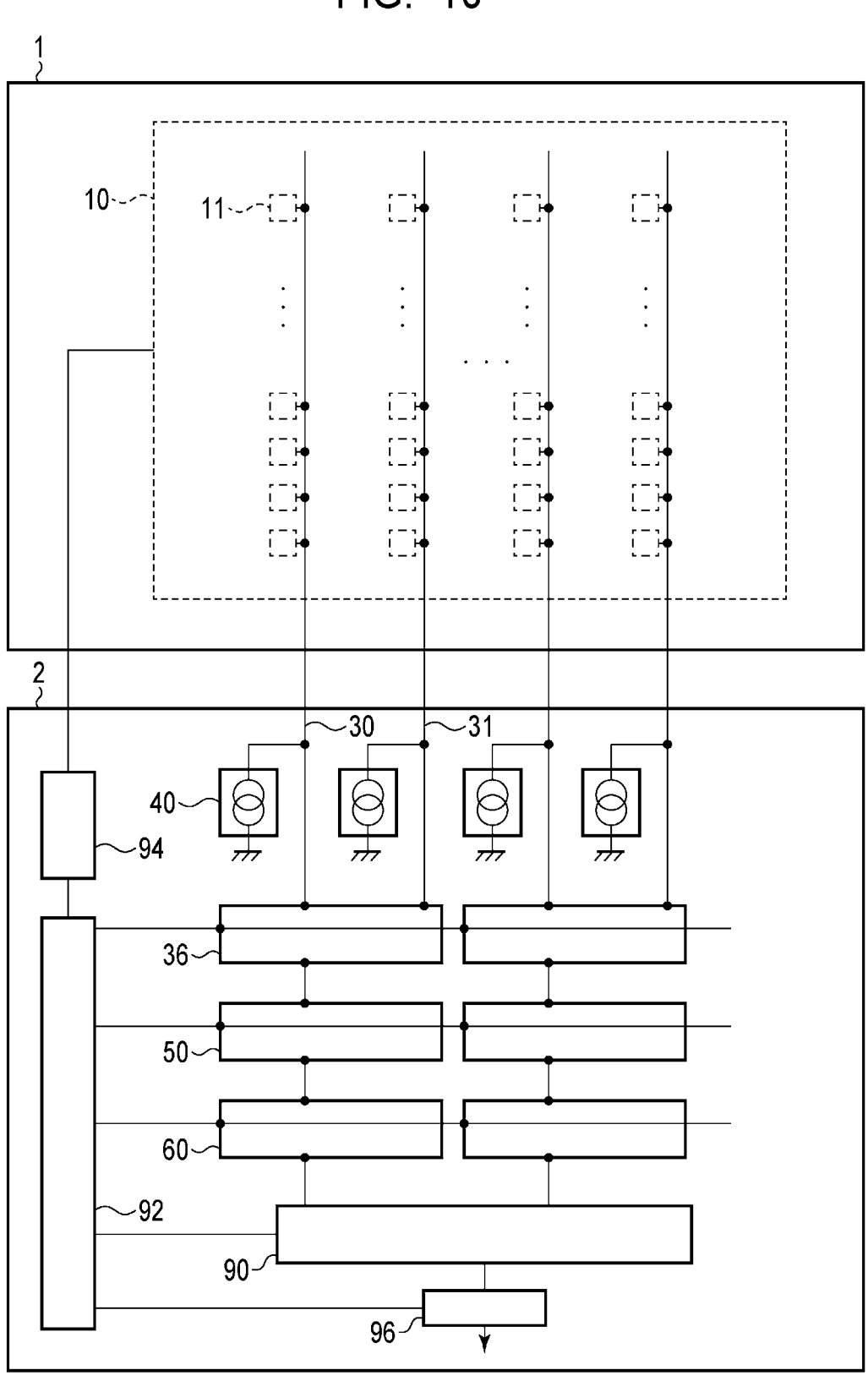
FIG. 10 is a block diagram illustrating a schematic configuration of a photoelectric conversion device according to a sixth embodiment.

FIG. 10 is a block diagram illustrating a schematic configuration of the photoelectric conversion device according to the present embodiment. The photoelectric conversion device further includes multiplexers 36 (first multiplexer). The multiplexers 36 are arranged in the circuit substrate 2. The control circuit 92 supplies a control signal for controlling the operations and timings of the multiplexers 36. In the present embodiment, of the plurality of vertical signal lines, a vertical signal line corresponding to the pixels 11 in the odd-numbered columns is referred to as a vertical signal line 30, and a vertical signal line corresponding to the pixels 11 in the even-numbered columns is referred to as a vertical signal line 31. Each of the multiplexer 36, the sample-and-hold unit 50, and the conversion unit 60 is arranged corresponding to a pair of the vertical signal lines 30 and 31.

Figure 11:
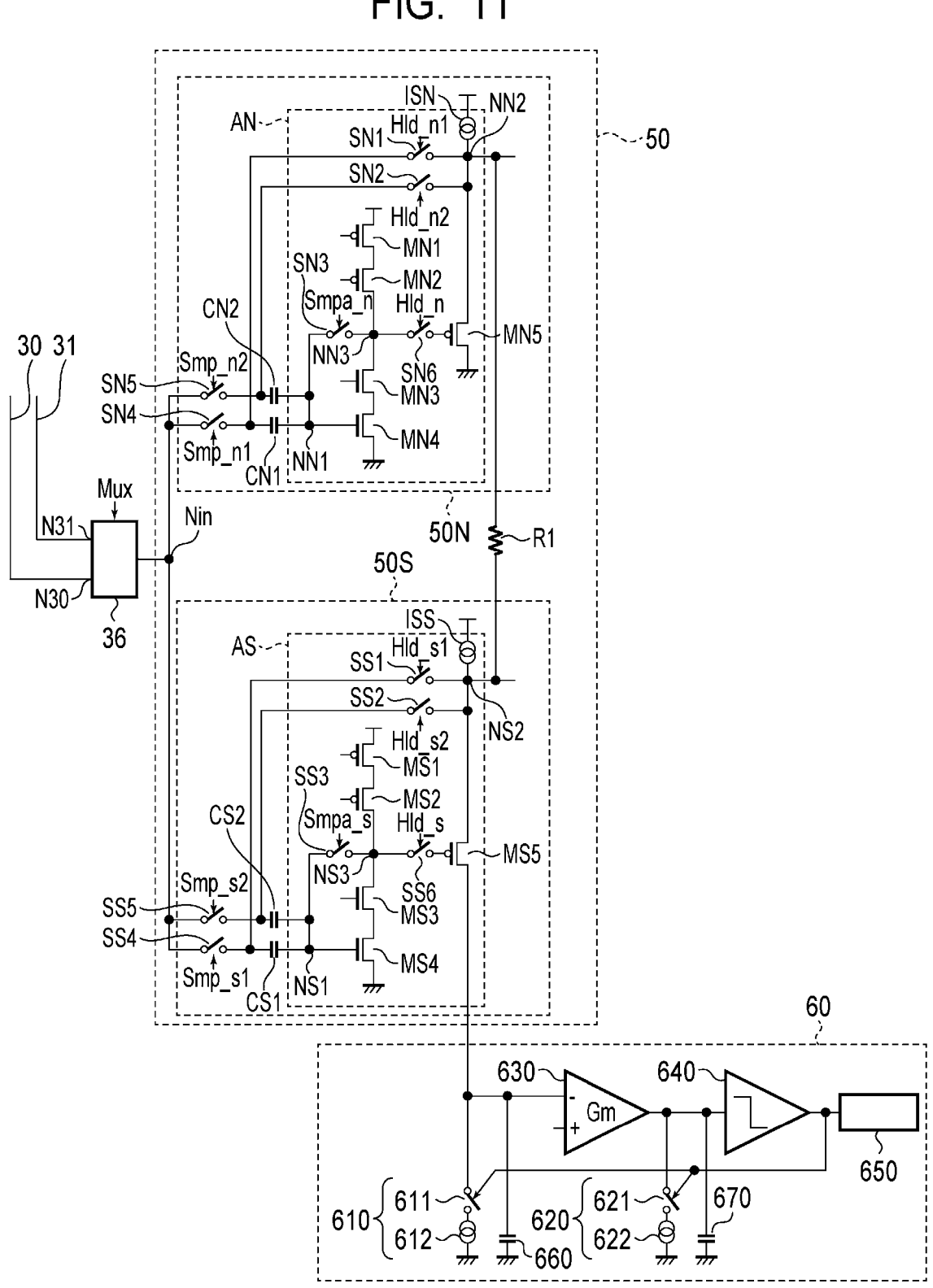
FIG. 11 is a circuit diagram illustrating a configuration of a sample-and-hold unit and a conversion unit according to the sixth embodiment.

FIG. 11 is a circuit diagram illustrating a configuration of the sample-and-hold unit 50 and the conversion unit 60 according to the present embodiment. FIG. 11 illustrates one multiplexer 36, one sample-and-hold unit 50, and one conversion unit 60 arranged corresponding to two vertical signal lines 30 and 31.

The vertical signal line 30 is connected to a first input terminal of the multiplexer 36 at a node N30. The vertical signal line 31 is connected to a second input terminal of the multiplexer 36 at a node N31. The first input terminal and the second input terminal are terminals provided on the input side of the multiplexer 36. An output terminal of the multiplexer 36 is connected to the node Nin. The output terminal of the multiplexer 36 is a terminal provided on the output side of the multiplexer 36. A control signal Mux is input from the control circuit 92 to a control terminal of the multiplexer 36. When the control signal Mux is at the high level, the multiplexer 36 outputs a signal of the node N30, and when the control signal Mux is at the low level, the multiplexer 36 outputs a signal of the node N31. Thus, the multiplexer 36 has a function of switching the connection relationship between the vertical signal lines 30 and 31 and the sample-and-hold unit 50.

Since the circuit configurations of the sample-and-hold circuit 50S and the conversion unit 60 are the same as those of FIG. 3, description thereof will be omitted. In addition to the configuration of FIG. 3, the sample-and-hold circuit 50N further includes switches SN2 and SN5 and a capacitor element CN2. Other circuit configurations are the same as those in FIG. 3, and thus description thereof will be omitted.

The switches SN2 and SN5 are controlled to be on or off in accordance with control signals input to these control terminals. The switches SN2 and SN5 may be formed of MOS transistors or the like. A control signal Hld_n1 is input from the control circuit 92 to the switch SN1. A control signal Hld_n2 is input from the control circuit 92 to the switch SN2. A control signal Smp_n1 is input from the control circuit 92 to the switch SN4. A control signal Smp_n2 is input from the control circuit 92 to the switch SN5.

A first terminal of the switch SN5 is connected to the node Nin. A second terminal of the switch SN5 is connected to a first terminal of the capacitor element CN2 and a first terminal of the switch SN2. A second terminal of the capacitor element CN2 is connected to the node NN1. A second terminal of the switch SN2 is connected to the node NN2.

Thus, in the present embodiment, the sample-and-hold circuit 50N can sample two reset signals (the first reset signal and the second reset signal) from the two vertical signal lines 30 and 31, respectively. The sample-and-hold circuit 50S can sample two photoelectric conversion signals (first photoelectric conversion signal and second photoelectric conversion signal) from the two vertical signal lines 30 and 31, respectively.

Figure 12:
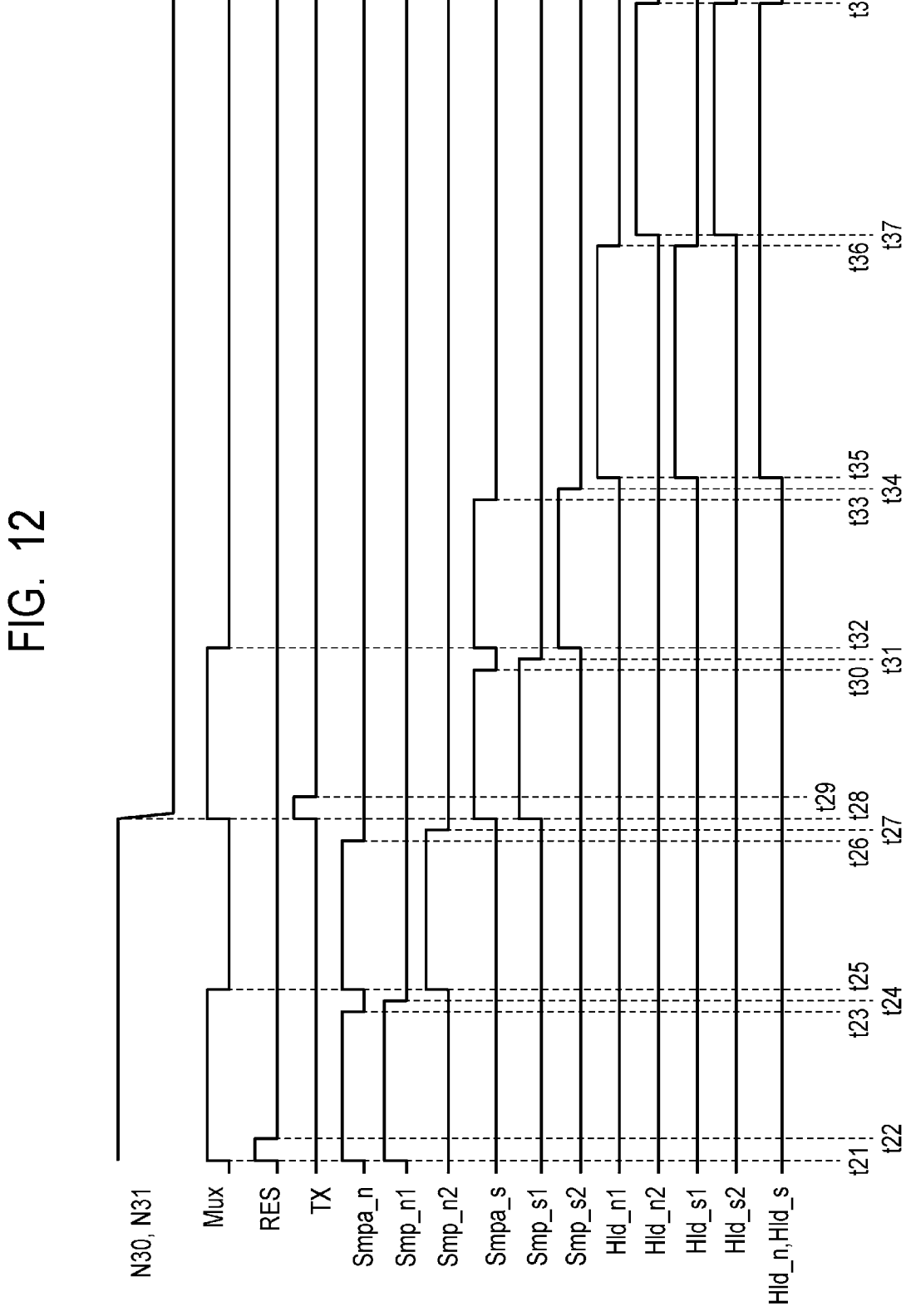
FIG. 12 is a timing chart illustrating an operation of the photoelectric conversion device according to the sixth embodiment.

FIG. 12 is a timing chart illustrating an operation of the photoelectric conversion device according to the present embodiment. In the description of FIG. 12, the description of the same matter as in FIG. 4 may be omitted or simplified. FIG. 12 illustrates the potential levels of the control signals RES and TX and the potential level of the control signal Mux. FIG. 12 also illustrates potential levels of the control signals Smpa_n, Smp_n1, Smp_n2, Smpa_s, Smp_s1, Smp_s2, Hld_n1, Hld_n2, Hld_s1, Hld_s2, Hld_n, and Hld_s. FIG. 12 also illustrates changes in potentials at the nodes N30 and N31. Since the change timings of the potential levels of the nodes N30 and N31 are the same, the change in potential at the nodes N30 and N31 is collectively illustrated in FIG. 12.

At time t21, the control signal RES becomes the high level, and at time t22, the control signal RES becomes the low level. By these operations, the reset transistor M2 is turned on in a period from the time t21 to the time t22, and the potential of the node FD is reset. In response to this operation, the potentials of the nodes N30 and N31 become the level of the first reset signal and the level of the second reset signal, respectively.

At the time t21, the control signals Smpa_n and Smp_n1 become the high level. As a result, the switches SN3 and SN4 are turned on. At the time t21, the control signal Mux becomes the high level. Thus, the vertical signal line 30 is connected to the capacitor element CN1 of the sample-and-hold circuit 50N. Thereafter, the sample-and-hold circuit 50N enters a state in which sampling of the first reset signal can be performed.

At time t23, the control signal Smpa_n becomes the low level. Accordingly, the switch SN3 is turned off, and the potential of the first reset signal is held in the capacitor element CN1. At time t24, the control signal Smp_n1 becomes the low level. As a result, the switch SN4 is turned off, and the vertical signal line 30 and the capacitor element CN1 of the sample-and-hold circuit 50N are disconnected.

At time t25, the control signals Smpa_n and Smp_n2 become the high level. As a result, the switches SN3 and SN5 are turned on. At the time t25, the control signal Mux becomes the low level. Thus, the vertical signal line 31 is connected to the capacitor element CN2 of the sample-and-hold circuit 50N. Thereafter, the sample-and-hold circuit 50N is in a state in which the second reset signal can be sampled.

At time t26, the control signal Smpa_n becomes the low level. Accordingly, the switch SN3 is turned off, and the potential of the second reset signal is held in the capacitor element CN2. At time t27, the control signal Smp_n2 becomes the low level. As a result, the switch SN5 is turned off, and the vertical signal line 31 and the capacitor element CN2 of the sample-and-hold circuit 50N are disconnected.

At time t28, the control signal TX becomes the high level, and at time t29, the control signal TX becomes the low level. By these operations, in a period from the time t28 to the time t29, the transfer transistor M1 is turned on, and the charges accumulated in the photoelectric conversion element PD is transferred to the node FD. The potential of the node FD decreases in accordance with the amount of transferred charge. By this charge transfer, the potentials of the vertical signal lines 30 and 31 are decreased, and the potentials of the nodes N30 and N31 become the level of the first photoelectric conversion signal and the level of the second photoelectric conversion signal, respectively.

At the time t28, the control signals Smpa_s and Smp_s1 become the high level. As a result, the switches SS3 and SS4 are turned on. At the time t28, the control signal Mux becomes the high level. Thus, the vertical signal line 30 is connected to the capacitor element CS1 of the sample-and-hold circuit 50S. Thereafter, the sample-and-hold circuit 50S enters a state in which sampling of the first photoelectric conversion signal can be performed.

At time t30, the control signal Smpa_s becomes the low level. As a result, the switch SS3 is turned off, and the potential of the first photoelectric conversion signal is held in the capacitor element CS1. At time t31, the control signal Smp_s1 becomes the low level. As a result, the switch SS4 is turned off, and the vertical signal line 30 and the capacitor element CS1 of the sample-and-hold circuit 50S are disconnected.

At time t32, the control signals Smpa_s and Smp_s2 become the high level. As a result, the switches SS3 and SS5 are turned on. At the time t32, the control signal Mux becomes the low level. Thus, the vertical signal line 31 is connected to the capacitor element CS2 of the sample-andhold circuit 50S. Thereafter, the sample-and-hold circuit 50S enters a state in which sampling of the second photoelectric conversion signal can be performed.

At time t33, the control signal Smpa_s becomes the low level. As a result, the switch SS3 is turned off, and the potential of the second photoelectric conversion signal is held in the capacitor element CS2. At time t34, the control signal Smp_s2 becomes the low level. As a result, the switch SS5 is turned off, and the vertical signal line 31 and the capacitor element CS2 of the sample-and-hold circuit 50S are disconnected.

At time t35, the control signals Hld_n and Hld_n1 become the high level. As a result, the switches SN6 and SN1 are turned on, and the potential of the first reset signal is output from the node NN2 of the sample-and-hold circuit 50N. At the same time, at the time t35, the control signals Hld_s and Hld_s1 become the high level. As a result, the switches SS6 and SS1 are turned on, and the potential of the first photo-electric conversion signal is output from the node NS2 of the sample-and-hold circuit 50S. Then, at time t36, the control signals Hld_n1 and Hld_s1 become the low level, and the switches SN1 and SS1 are turned off.

Therefore, in a period from the time t35 to the time t36, a current corresponding to the difference between the potential of the first reset signal of the node NN2 and the potential of the first photoelectric conversion signal of the node NS2 is input to the conversion unit 60. The conversion unit 60 converts an analog signal based on the current into a digital signal.

At time t37, the control signal Hld_n2 becomes the high level. As a result, the switch SN2 is turned on, and the potential of the second reset signal is output from the node NN2 of the sample-and-hold circuit 50N. At the same time, at the time t37, the control signal Hld_s2 becomes the high level. As a result, the switch SS2 is turned on, and the potential of the second photoelectric conversion signal is output from the node NS2 of the sample-and-hold circuit 50S. Then, at time t38, the control signals Hld_n, Hld_s, Hld_n2, and Hld_s2 become the low level, and the switches SN6, SS6, SN2, and SS2 are turned off.

Therefore, from the time t37 to the time t38, a current corresponding to the difference between the potential of the second reset signal of the node NN2 and the potential of the second photoelectric conversion signal of the node NS2 is input to the conversion unit 60. The conversion unit 60 converts an analog signal based on the current into a digital signal.

As described above, in the photoelectric conversion device of the present embodiment, the vertical signal lines 30 and 31 of the two columns can be switched by the multiplexer 36 and connected to the sample-and-hold unit 50. Thereby, the first reset signal and the first photoelectric conversion signal can be read out from the vertical signal line 30, the second reset signal and the second photoelectric conversion signal can be read out from the vertical signal line 31, and AD conversion can be performed, whereby digital signals of two columns can be read out. Therefore, since one sample-and-hold unit 50 and one conversion unit 60 can be shared by two columns, the number of sample-and-hold units 50 and the conversion units 60 can be reduced, and power consumption can be reduced.

As described above, according to the present embodiment, in addition to providing the photoelectric conversion device in which the accuracy of the output signal is improved as in the first embodiment, power consumption can be reduced.

Seventh Embodiment

The photoelectric conversion device according to the present embodiment will be described. The photoelectric conversion device of the present embodiment is an example in which the configurations of the sample-and-hold units 50 and the conversion units 60 of the photoelectric conversion device of the sixth embodiment are modified.

Figure 13:
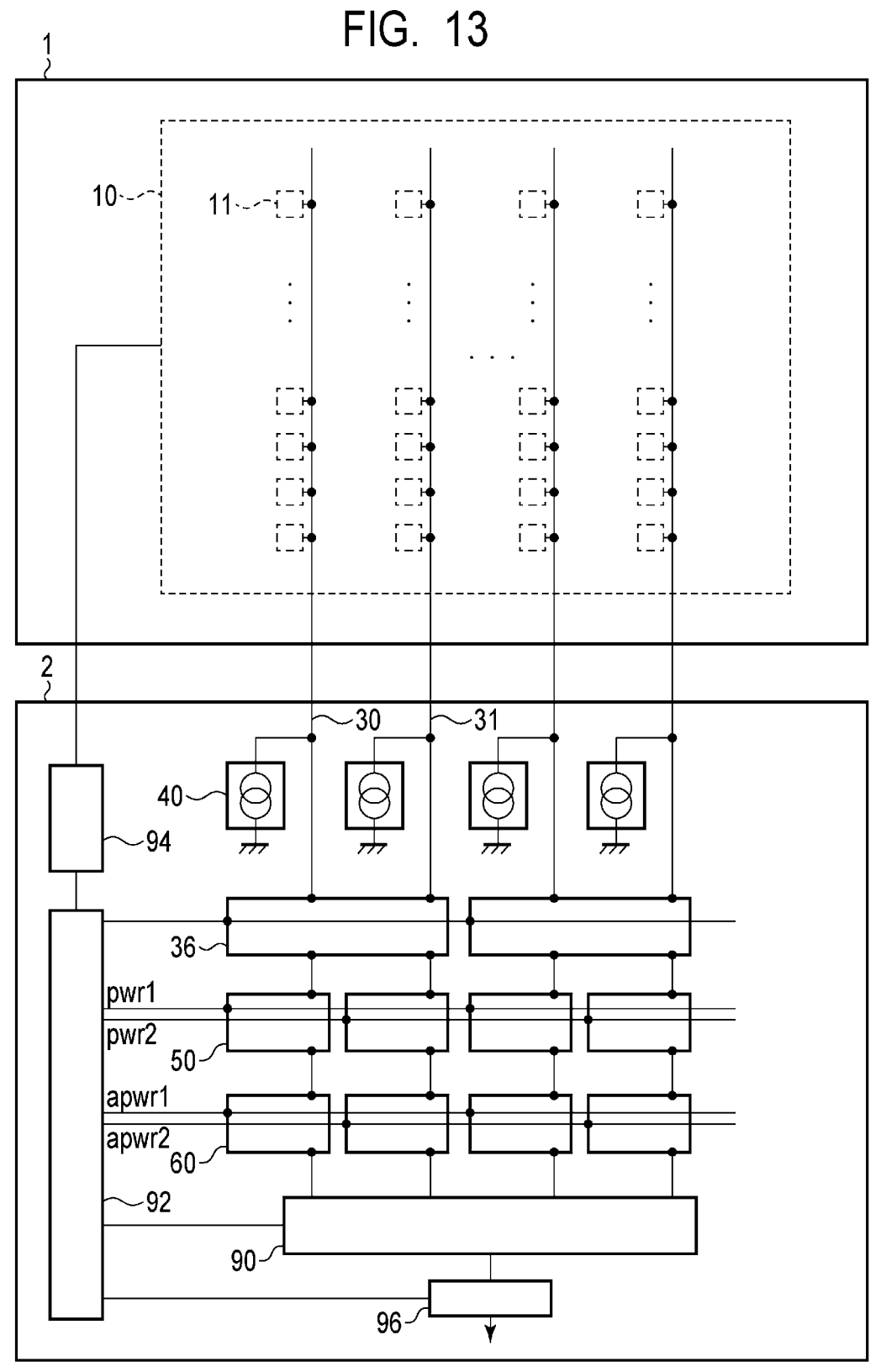

FIG. 13 is a block diagram illustrating a schematic configuration of a photoelectric conversion device according to the present embodiment. The present embodiment is different from the sixth embodiment in that the sample-and-hold unit 50 and the conversion unit 60 are arranged corresponding to each column. Further, in the present embodiment, it is possible to perform an operation of saving power in one of the sample-and-hold unit 50 and the conversion unit 60 of the odd-numbered column and the sample-and-hold unit 50 and the conversion unit 60 of the even-numbered column. Here, power saving may include both operating with less power consumption than the normal operating state and stopping the operation. That is, in the present embodiment, it can be said that these circuits can be controlled such that the power consumption of the sample-and-hold unit 50 and the conversion unit 60 of the odd-numbered column and the power consumption of the sample-and-hold unit 50 and the conversion unit 60 of the even-numbered column are different from each other.

The control circuit 92 outputs a control signal pwr1 for controlling whether or not the power saving operation of the sample-and-hold units 50 of the odd-numbered column is enabled via a signal line connected to the sample-and-hold units 50 of the odd-numbered column. Further, the control circuit 92 outputs a control signal pwr2 for controlling whether or not the power saving operation of the sample-and-hold units 50 of the even-numbered column is enabled via a signal line connected to the sample-and-hold units 50 of the even-numbered column. Thus, the control circuit 92 may save power in either the sample-and-hold units 50 of the odd-numbered columns or the sample-and-hold units 50 of the even-numbered columns. Alternatively, the control circuit 92 may save power in neither the sample-and-hold units 50 of the odd-numbered columns nor the sample-and-hold units 50 of the even-numbered columns.

The control circuit 92 outputs, via one control line, a control signal apwr1 for controlling whether or not the power saving operation of the conversion unit 60 of the odd-numbered column is enabled, via a signal line connected to the conversion unit 60 of the odd-numbered column. Further, the control circuit 92 outputs, via another control line, a control signal apwr2 for controlling whether or not the power saving operation of the conversion unit 60 of the even-numbered column is enabled, via a signal line connected to the conversion unit 60 of the even-numbered column. As a result, the control circuit 92 may save power in either one of the conversion units 60 of the odd-numbered columns or the conversion units 60 of the even-numbered columns. Alternatively, the control circuit 92 may save power in neither the conversion units 60 of the odd-numbered columns nor the conversion units 60 of the even-numbered columns.

For example, when the photoelectric conversion device is operated in the power saving mode, the control circuit 92 switches the sample-and-hold unit 50 of the even-numbered column and the conversion unit 60 of the even-numbered column to the power saving operation. Then, the multiplexer 36 performs an operation so that both the signals read from the vertical signal lines 30 of the odd-numbered columns and the signals read from the vertical signal lines 31 of the even-numbered columns are output to the sample-and-hold units 50 of the odd-numbered columns. This makes it possible to save power in the sample-and-hold units 50 of the even-numbered columns and the conversion units 60 of the even-numbered columns, thereby reducing power consumption of the photoelectric conversion device. In the operation in the power saving mode, the operation of the even-numbered columns and the operation of the odd-numbered columns may be opposite. That is, power consumption of the sample-and-hold unit 50 of the odd-numbered columns and the conversion unit 60 of the odd-numbered columns may be saved.

As described above, according to the present embodiment, in addition to providing the photoelectric conversion device in which the accuracy of the output signal is improved as in the first embodiment, power consumption can be reduced.

When the photoelectric conversion device is operated in the normal power mode, the control circuit 92 switches both the sample-and-hold unit 50 and the conversion unit 60 of the even-numbered column and the odd-numbered column so as not to perform the power saving operation. Then, the multiplexer 36 performs an operation so that all of the signals read from the vertical signal lines 30 of the odd-numbered columns are output to the sample-and-hold units 50 of the odd-numbered columns, and all of the signals read from the vertical signal lines 31 of the even-numbered columns are output to the sample-and-hold units 50 of the even-numbered columns. In the normal power mode, power consumption increases as compared with the power saving mode, but since even-numbered columns and odd-numbered columns can be read in parallel, the reading speed is improved. The normal power mode can be applied to, for example, a high-precision imaging mode such as a high dynamic range.

As described above, according to the present embodiment, the power saving mode and the normal power mode can be switched according to the required signal acquisition condition.

Eighth Embodiment

The photoelectric conversion device according to the present embodiment will be described. The photoelectric conversion device of the present embodiment is an example in which a multiplexer for selecting one of two vertical signal lines in the same column is further added to the photoelectric conversion device of the seventh embodiment.

Figure 14:
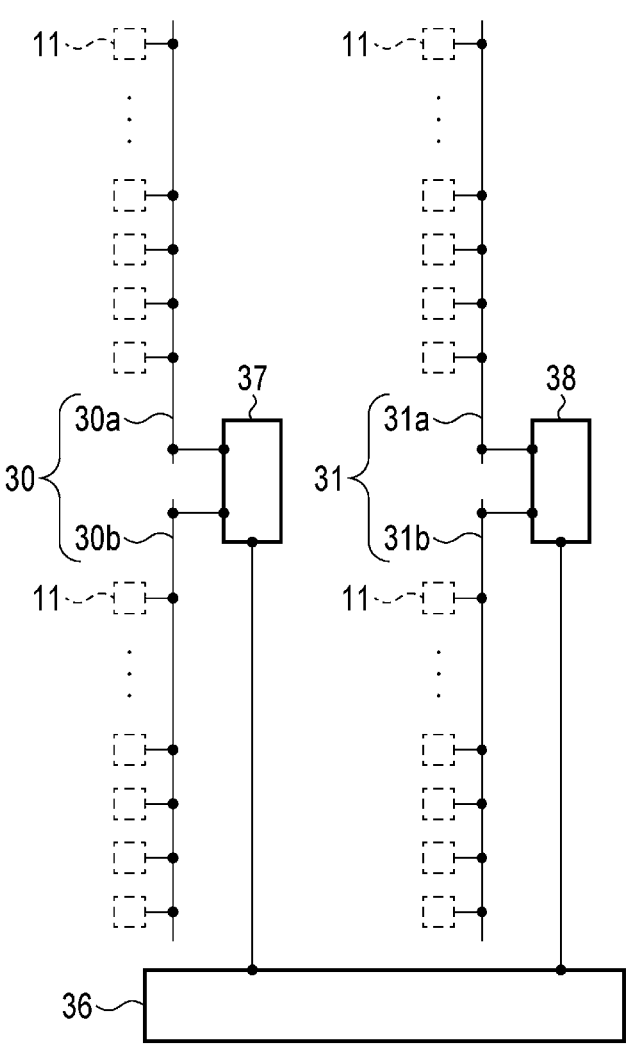
FIG. 14 is a schematic diagram illustrating a configuration of vertical signal lines and multiplexers according to an eighth embodiment.

FIG. 14 is a schematic diagram illustrating a configuration of vertical signal lines and multiplexers according to the present embodiment. FIG. 14 illustrates the configuration of the pixels, the vertical signal lines, and the multiplexers in the block diagram of the photoelectric conversion device.

The vertical signal lines 30 of the odd-numbered column are divided into two vertical signal lines 30a and 30b. The vertical signal line 30a is connected to a part (an upper half in the example of FIG. 14) of the plurality of pixels 11 arranged in one column. The vertical signal line 30b is connected to another part (a lower half in the example of FIG. 14) of the plurality of pixels 11 arranged in one column.

The vertical signal lines 31 of the even-numbered column are divided into two vertical signal lines 31a and 31b. The vertical signal line 31a is connected to a part (an upper half in the example of FIG. 14) of the plurality of pixels 11 arranged in one column. The vertical signal line 31b is connected to another part (a lower half in the example of FIG. 14) of the plurality of pixels 11 arranged in one column.

The photoelectric conversion device further includes a multiplexer 37 for selecting one of the vertical signal lines 30a and 30b and a multiplexer 38 for selecting one of the vertical signal lines 31a and 31b. The multiplexers 37 and 38 are controlled in accordance with control signals output from the control circuit 92.

The vertical signal lines 30a and 30b are connected to two input terminals of the multiplexer 37, respectively. The vertical signal lines 31a and 31b are connected to two input terminals of the multiplexer 38, respectively. An output terminal of the multiplexer 37 and an output terminal of the multiplexer 38 are connected to two input terminals of the multiplexer 36.

According to the present embodiment, in addition to providing a photoelectric conversion device whose output signal accuracy is improved as in the first embodiment, power consumption can be reduced as in the seventh embodiment. In the present embodiment, the vertical signal line of one column is divided into two regions, and a signal can be read from one of them by controlling the multiplexer. This improves the degree of freedom of reading.

Ninth Embodiment

The photoelectric conversion device according to the present embodiment will be described. The photoelectric conversion device of the present embodiment is an example in which two vertical signal lines are arranged in parallel in the same column in the photoelectric conversion device of the seventh embodiment.

Figure 15:
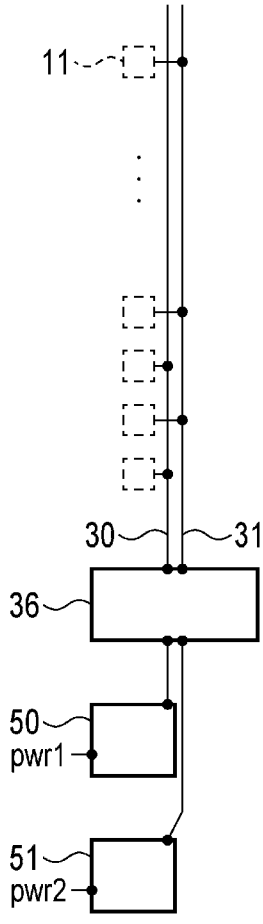
FIG. 15 is a schematic diagram illustrating a configuration of vertical signal lines, a multiplexer, and sample-and-hold units according to a ninth embodiment.

FIG. 15 is a schematic diagram illustrating a configuration of vertical signal lines, a multiplexer, and sample-and-hold units according to the present embodiment. FIG. 15 illustrates the configuration of the pixels, the vertical signal lines, the multiplexer, and the sample-and-hold units in the block diagram of the photoelectric conversion device.

In the present embodiment, two vertical signal lines 30 and 31 are arranged corresponding to the pixels 11 in one column. The pixels 11 of the odd-numbered column are connected to the vertical signal line 31, and the pixels 11 of the even-numbered column are connected to the vertical signal line 30.

In the present embodiment, two sample-and-hold units 50 and 51 are arranged corresponding to the pixels 11 in one column. The signal output to the vertical signal line 30 is held in the sample-and-hold unit 50, and the signal output to the vertical signal line 31 is held in the sample-and-hold unit 51. The sample-and-hold units 50 and 51 are individually controlled by control signals pwr1 and pwr2, respectively.

According to the present embodiment, in addition to providing a photoelectric conversion device whose output signal accuracy is improved as in the first embodiment, power consumption can be reduced as in the seventh embodiment. Further, in the present embodiment, two vertical signal lines are arranged in one column, and control such as reading signals from the two vertical signal lines simultaneously or reading signals from only one of the two vertical signal lines is possible. This improves the degree of freedom of reading.

Tenth Embodiment

The photoelectric conversion device according to the present embodiment will be described. The photoelectric conversion device of the present embodiment is an example in which a multiplexer is further arranged between the sample-and-hold unit and the conversion unit in the photoelectric conversion device of the seventh embodiment.

Figure 16:
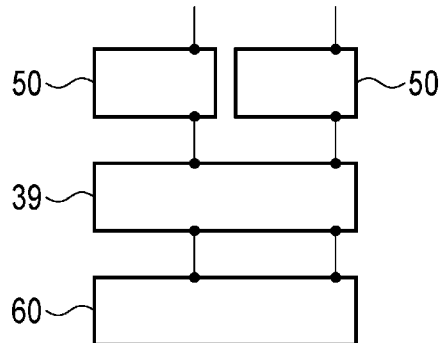
FIG. 16 is a schematic diagram illustrating a configuration of sample-and-hold units, a multiplexer, and a conversion unit according to a tenth embodiment.

FIG. 16 is a schematic diagram illustrating a configuration of sample-and-hold units, a multiplexer, and a conversion unit according to the present embodiment. FIG. 16 illustrates the configuration of the sample-and-hold units, the multiplexer, and the conversion unit in the block diagram of the photoelectric conversion device.

As illustrated in FIG. 16, a multiplexer 39 (second multiplexer) is further arranged between the output terminals of the two sample-and-hold units 50 and the input terminal of the conversion unit 60 corresponding to the pixels 11 of two columns (odd-numbered column and even-numbered column). Thus, one conversion unit 60 is shared by two sample-and-hold units 50. The multiplexer 39 is controlled in accordance with a control signal output from the control circuit 92.

According to the present embodiment, in addition to providing a photoelectric conversion device whose output signal accuracy is improved as in the first embodiment, power consumption can be reduced as in the seventh embodiment. Further, the connection between the two sample-and-hold units 50 and the one conversion unit 60 can be switched, and the degree of freedom of reading is improved.

An example of the operation of the multiplexer 39 will be described. It is assumed that each of the plurality of sample-and-hold units 50 holds a low gain signal and a high gain signal. In this case, the signal output order is set such as the low gain signal from the sample-and-hold unit 50 of the odd-numbered column→the low gain signal from the sample-and-hold unit 50 of the even-numbered column→the high gain signal from the sample-and-hold unit 50 of the even-numbered column→the high gain signal from the sample-and-hold unit 50 of the odd-numbered column. By controlling the sample-and-hold units 50, the multiplexer 39, and the conversion unit 60 in such a signal output order, the number of times of operation switching between the low gain signal and the high gain signal in the conversion unit 60 is reduced, and the operation is simplified.

Eleventh Embodiment

The photoelectric conversion device according to the present embodiment will be described. The photoelectric conversion device of the present embodiment is obtained by modifying the photoelectric conversion device of the seventh embodiment into a stacked structure of three substrates.

Figure 17:
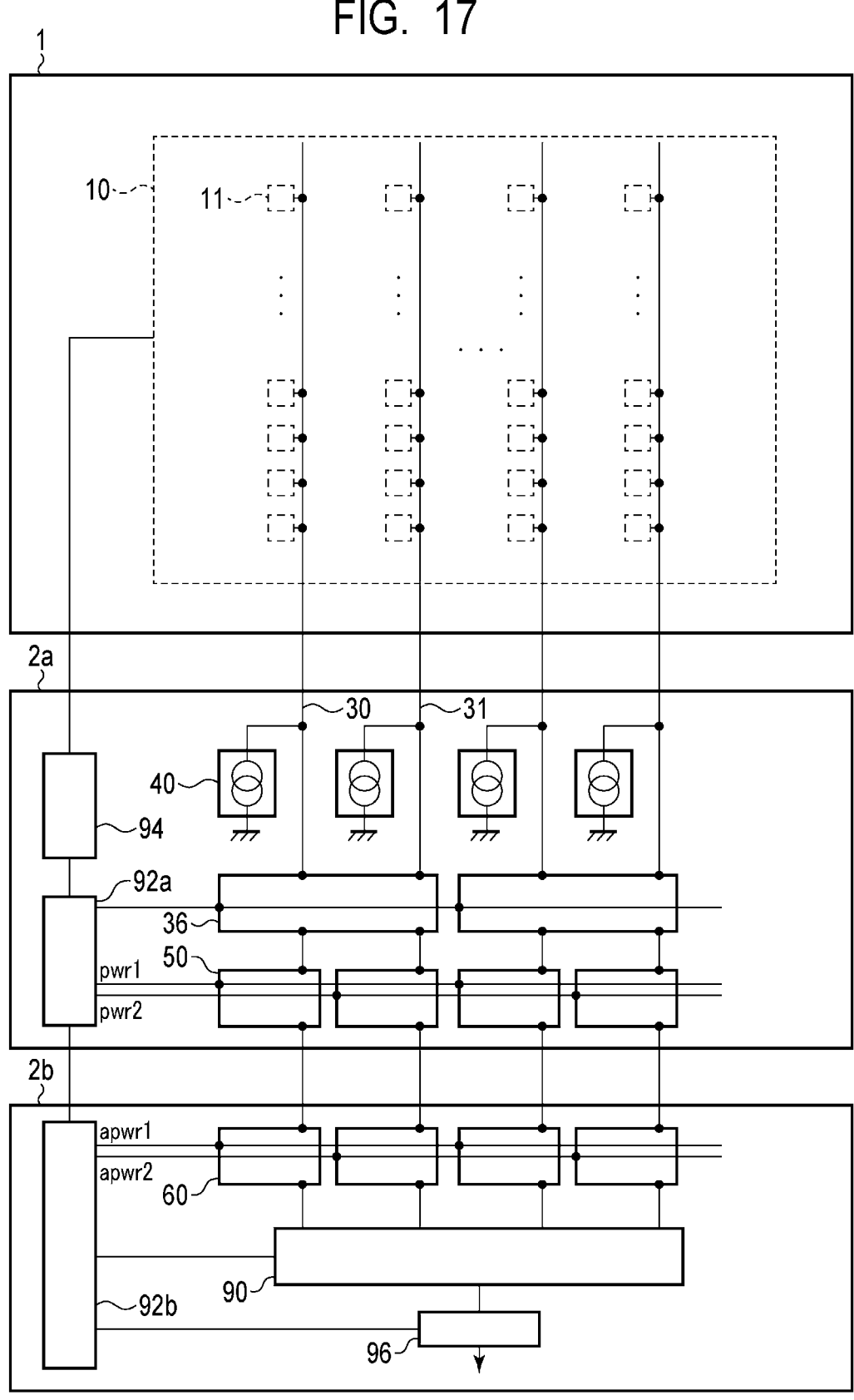
FIG. 17 is a block diagram illustrating a schematic configuration of a photoelectric conversion device according to an eleventh embodiment.

FIG. 17 is a block diagram illustrating a schematic configuration of a photoelectric conversion device according to the present embodiment. In the present embodiment, the photoelectric conversion device includes a pixel substrate 1 (first substrate), a circuit substrate 2a (second substrate), and a circuit substrate 2b (third substrate). The pixel substrate 1, the circuit substrate 2a, and the circuit substrate 2b are different semiconductor substrates, and are stacked on each other. In the seventh embodiment, the control circuit 92 is divided into control circuits 92a and 92b.

The pixel array 10 is arranged in the pixel substrate 1. The current sources 40, the multiplexers 36, the sample-and-hold units 50, the vertical scanning circuit 94, and the control circuit 92a are arranged in the circuit substrate 2a. The conversion units 60, the data processing unit 90 (signal processing circuit), the control circuit 92b, and the output circuit 96 are arranged in the circuit substrate 2b.

According to the present embodiment, in addition to providing a photoelectric conversion device whose output signal accuracy is improved as in the first embodiment, power consumption can be reduced as in the seventh embodiment. Further, since the circuit substrate is divided into two substrates, the chip of the photoelectric conversion device can be downsized.

Note that the circuit configuration in FIG. 17 is an example, and a combination of circuits arranged in each substrate is not limited to that illustrated in FIG. 17. For example, part or all of the circuits constituting the conversion unit 60 may be arranged in the circuit substrate 2a.

Twelfth Embodiment

Figure 18:
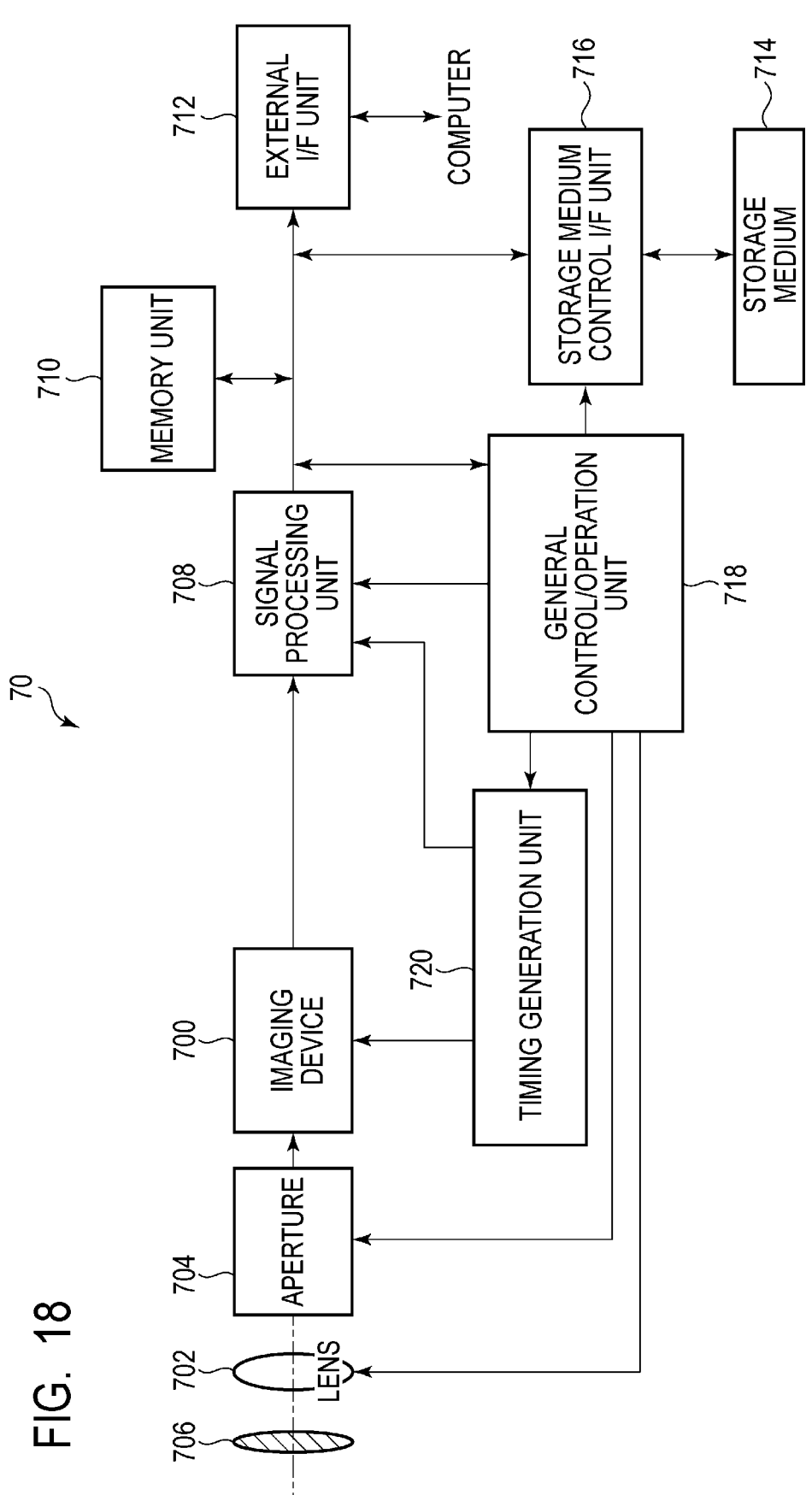
FIG. 18 is a block diagram of equipment according to a twelfth embodiment.

The photoelectric conversion device of the above embodiments can be applied to various equipment. Examples of the equipment include a digital still camera, a digital camcorder, a camera head, a copying machine, a facsimile, a mobile phone, a vehicle-mounted camera, an observation satellite, and a surveillance camera. FIG. 18 is a block diagram of a digital still camera as an example of equipment.

The equipment 70 illustrated in FIG. 18 includes a barrier 706, a lens 702, an aperture 704, and an imaging device 700 (an example of a photoelectric conversion device). The equipment 70 further includes a signal processing unit (processing device) 708, a timing generation unit 720, a general control/operation unit 718 (control device), a memory unit 710 (storage device), a storage medium control I/F unit 716, a storage medium 714, and an external I/F unit 712. At least one of the barrier 706, the lens 702, and the aperture 704 is an optical device corresponding to the device. The barrier 706 protects the lens 702, and the lens 702 forms an optical image of an object on the imaging device 700. The aperture 704 varies the amount of light passing through the lens 702. The imaging device 700 is configured as in the above embodiments, and converts an optical image formed by the lens 702 into image data (image signal). The signal processing unit 708 performs various corrections, data compression, and the like on the image data output from the imaging device 700. The timing generation unit 720 outputs various timing signals to the imaging device 700 and the signal processing unit 708. The general control/operation unit 718 controls the entire digital still camera, and the memory unit 710 temporarily stores image data. The storage medium control I/F unit 716 is an interface for storing or reading image data on the storage medium 714, and the storage medium 714 is a detachable storage medium such as a semiconductor memory for storing or reading captured image data. An external I/F unit 712 is an interface for communicating with an external computer or the like. The timing signal or the like may be input from the outside of the equipment. The equipment 70 may further include a display device (a monitor, an electronic view finder, or the like) for displaying information obtained by the photoelectric conversion device. The equipment includes at least a photoelectric conversion device. Further, the equipment 70 includes at least one of an optical device, a control device, a processing device, a display device, a storage device, and a mechanical device that operates based on information obtained by the photoelectric conversion device. The mechanical device is a movable portion (for example, a robot arm) that receives a signal of the photoelectric conversion device and operates.

Each pixel may include a plurality of photoelectric conversion units (first photoelectric conversion unit and second photoelectric conversion unit). The signal processing unit

708 may be configured to process a pixel signal based on charges generated in the first photoelectric conversion unit and a pixel signal based on charges generated in the second photoelectric conversion unit, and acquire distance information from the imaging device 700 to the object.

Thirteenth Embodiment

Figure 19A:
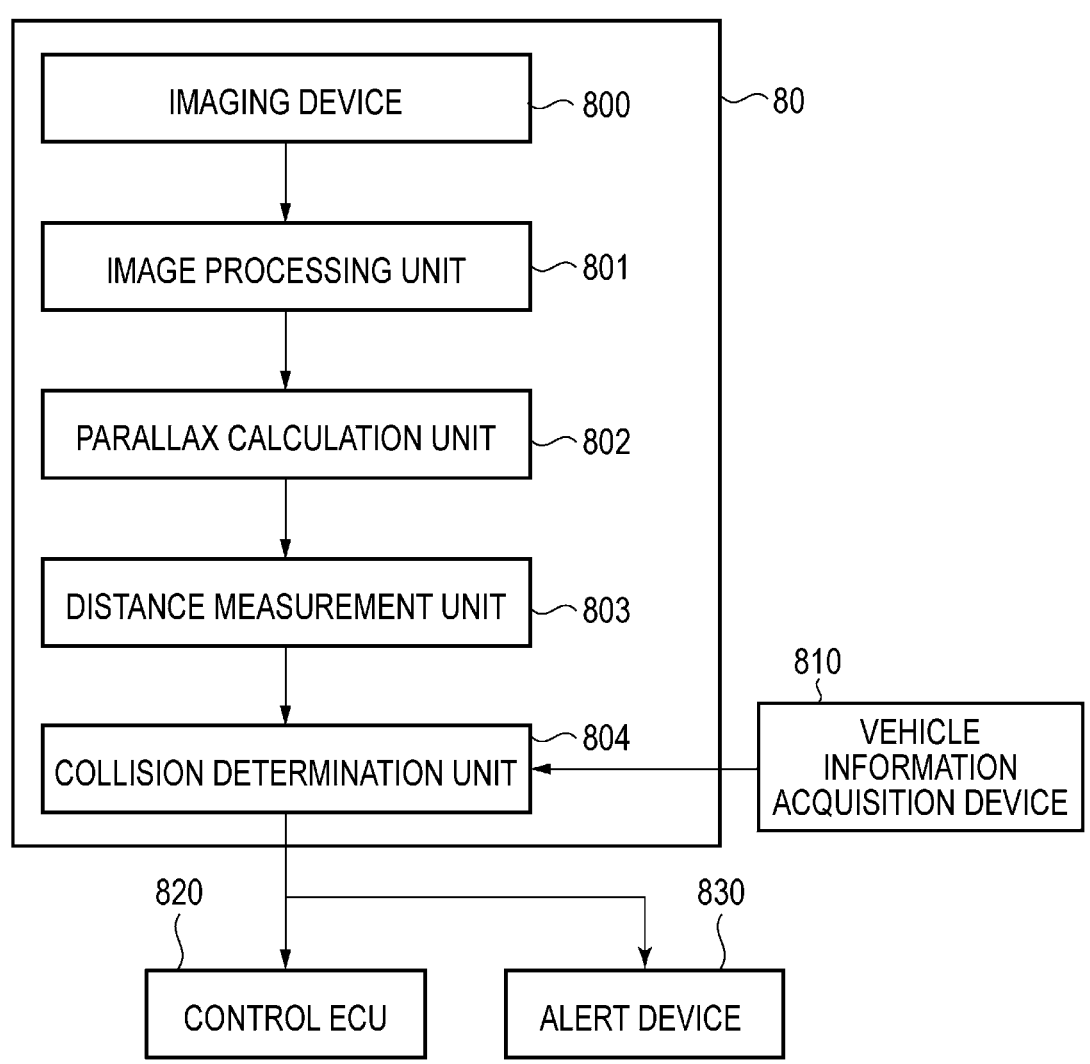
FIGS. 19A and 19B are block diagrams of equipment according to a thirteenth embodiment.
Figure 19B:
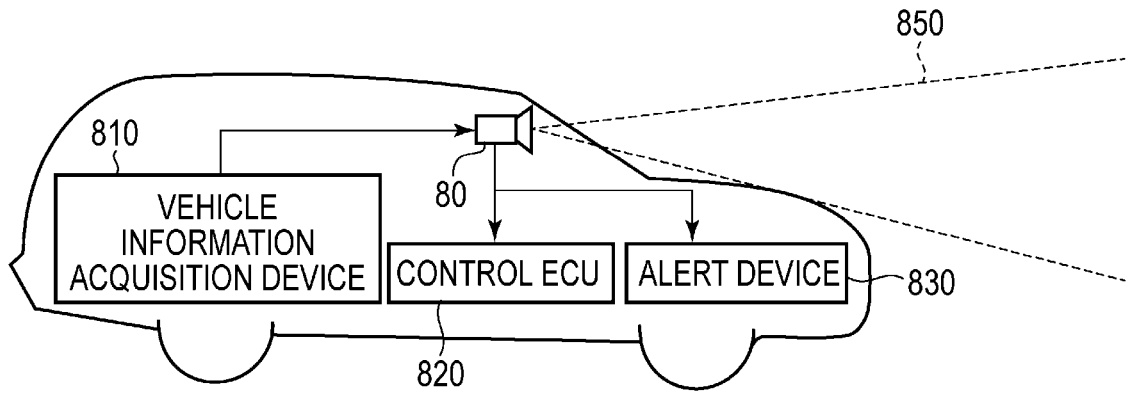

FIGS. 19A and 19B are block diagrams of equipment relating to the vehicle-mounted camera according to the present embodiment. The equipment 80 includes an imaging device 800 (an example of the photoelectric conversion device) of the above-described embodiments and a signal processing device (processing device) that processes a signal from the imaging device 800. The equipment 80 includes an image processing unit 801 that performs image processing on a plurality of pieces of image data acquired by the imaging device 800, and a parallax calculation unit 802 that calculates parallax (phase difference of parallax images) from the plurality of pieces of image data acquired by the equipment 80. The equipment 80 includes a distance measurement unit 803 that calculates a distance to an object based on the calculated parallax, and a collision determination unit 804 that determines whether or not there is a possibility of collision based on the calculated distance. Here, the parallax calculation unit 802 and the distance measurement unit 803 are examples of a distance information acquisition unit that acquires distance information to the object. That is, the distance information is information on a parallax, a defocus amount, a distance to the object, and the like. The collision determination unit 804 may determine the possibility of collision using any of these pieces of distance information. The distance information acquisition unit may be realized by dedicatedly designed hardware or software modules. Further, it may be realized by a field programmable gate array (FPGA), an application specific integrated circuit (ASIC) or a combination thereof.

The equipment 80 is connected to the vehicle information acquisition device 810, and can acquire vehicle information such as a vehicle speed, a yaw rate, and a steering angle. Further, the equipment 80 is connected to a control ECU 820 which is a control device that outputs a control signal for generating a braking force to the vehicle based on the determination result of the collision determination unit 804. The equipment 80 is also connected to an alert device 830 that issues an alert to the driver based on the determination result of the collision determination unit 804. For example, when the collision possibility is high as the determination result of the collision determination unit 804, the control ECU 820 performs vehicle control to avoid collision or reduce damage by braking, returning an accelerator, suppressing engine output, or the like. The alert device 830 alerts the user by sounding an alarm such as a sound, displaying alert information on a screen of a car navigation system or the like, or giving vibration to a seat belt or a steering wheel. The equipment 80 functions as a control unit that controls the operation of controlling the vehicle as described above.

In the present embodiment, an image of the periphery of the vehicle, for example, the front or the rear is captured by the equipment 80. FIG. 19B illustrates equipment in a case where an image is captured in front of the vehicle (image capturing range 850). The vehicle information acquisition device 810 as the imaging control unit sends an instruction to the equipment 80 or the imaging device 800 to perform the imaging operation. With such a configuration, the accuracy of distance measurement can be further improved.

Although the example of control for avoiding a collision to another vehicle has been described above, the embodiment is applicable to automatic driving control for following another vehicle, automatic driving control for not going out of a traffic lane, or the like. Furthermore, the equipment is not limited to a vehicle such as an automobile and can be applied to a movable body (movable apparatus) such as a ship, an airplane, a satellite, an industrial robot, and a consumer use robot, or the like, for example. In addition, the equipment can be widely applied to equipment which utilizes object recognition or biometric authentication, such as an intelligent transportation system (ITS), a surveillance system, or the like without being limited to movable bodies.

Modified Embodiments

The present invention is not limited to the above-described embodiments, and various modifications are possible. For example, an example in which some of the configurations of any of the embodiments are added to other embodiments or an example in which some of the configurations of any of the embodiments are replaced with some of the configurations of other embodiments is also an embodiment of the present invention.

The configurations of the pixel array 10 and the pixels 11 arranged in the photoelectric conversion device are not limited to those of the above-described embodiments. For example, a plurality of vertical signal lines may be arranged corresponding to pixels 11 of one column, and a plurality of selection transistors M4 may be arranged in one pixel 11. In this case, a vertical signal line which outputs a signal can be selected by turning on any one of the plurality of selection transistors M4. The configuration of the conversion unit 60 is not limited to the delta-sigma analog-to-digital conversion circuit as in the above-described embodiments. The conversion unit 60 may be a slope-type analog-to-digital conversion circuit that performs analog-to-digital conversion of an input signal by comparing an input signal with a reference signal by a comparison circuit. In that case, the comparison circuit may include capacitors and switches for auto-zero operation.

The disclosure of this specification includes a complementary set of the concepts described in this specification. That is, for example, if a description of "A is B" (A=B) is provided in this specification, this specification is intended to disclose or suggest that "A is not B" even if a description of "A is not B" (A≠B) is omitted. This is because it is assumed that "A is not B" is considered when "A is B" is described.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-030679, filed Mar. 1, 2022, which is hereby incorporated by reference herein in its entirety.

What is claimed is:

1. A photoelectric conversion device comprising:
a pixel configured to output a signal corresponding to incident light by photoelectric conversion;
a signal line connected to the pixel; and
a first signal holding unit to which a signal is input from the pixel via the signal line,
wherein the first signal holding unit includes:
a first capacitor element and a second capacitor element each having a first terminal and a second terminal and each configured to hold a signal input from the signal line to the first terminal;
an amplifier circuit having an input terminal and an output terminal, the second terminal of the first capacitor element and the second terminal of the second capacitor element being connected to the input terminal;
a first switch connected between the first terminal of the first capacitor element and the output terminal of the amplifier circuit;
a second switch connected between the first terminal of the second capacitor element and the output terminal of the amplifier circuit; and
a third switch connected to the input terminal of the amplifier circuit,
wherein the amplifier circuit includes a common source circuit and a source follower circuit arranged at a subsequent stage of the common source circuit, and
wherein the third switch is connected between the input terminal of the amplifier circuit and an output node of the common source circuit.

2. The photoelectric conversion device according to claim 1, wherein the first signal holding unit further includes:
a fourth switch connected between the signal line and the first terminal of the first capacitor element; and
a fifth switch connected between the signal line and the first terminal of the second capacitor element.

3. The photoelectric conversion device according to claim 2,
wherein in a period in which a signal from the pixel is held in the first capacitor element, the third switch is turned off before the fourth switch is turned off, and
wherein in a period in which a signal from the pixel is held in the second capacitor element, the third switch is turned off before the fifth switch is turned off.

4. The photoelectric conversion device according to claim 1 further comprising a second signal holding unit to which a signal based on a reset state of the pixel is input via the signal line.

5. The photoelectric conversion device according to claim 4 further comprising an analog-to-digital conversion unit to which a current flowing through the first signal holding unit and the second signal holding unit is input.

6. The photoelectric conversion device according to claim 5, wherein the analog-to-digital conversion unit is a delta-sigma analog-to-digital conversion circuit.

7. The photoelectric conversion device according to claim 1, wherein the third switch is connected between the input terminal of the amplifier circuit and a reference voltage node to which a predetermined voltage is supplied.

8. The photoelectric conversion device according to claim 1 comprising a plurality of the first signal holding units,
wherein one signal line is selectively connected to one of the plurality of first signal holding units.

9. The photoelectric conversion device according to claim 8 further comprising a circuit element commonly arranged for the plurality of first signal holding units,
wherein the circuit element is selectively connected to one of the plurality of first signal holding units.

10. The photoelectric conversion device according to claim 1, wherein the pixel includes:
a photoelectric conversion element configured to generate charges corresponding to the incident light;
a floating diffusion portion to which the charges are transferred;
an amplification transistor configured to output a signal based on the charges transferred to the floating diffusion portion; and
a capacitance control transistor configured to control capacitance of the floating diffusion portion.

11. The photoelectric conversion device according to claim 1, wherein the pixel includes a plurality of photoelectric conversion elements.

12. The photoelectric conversion device according to claim 11 further comprising a microlens arranged corresponding to the pixel,
wherein light passing through the same microlens is incident on each of the plurality of photoelectric conversion elements.

13. The photoelectric conversion device according to claim 1 comprising a plurality of the pixels and a plurality of the signal lines,
wherein the photoelectric conversion device further comprising a first multiplexer configured to switch a connection relationship between the plurality of signal lines and the first signal holding unit.

14. The photoelectric conversion device according to claim 13 comprising a plurality of the first signal holding units,
wherein the first multiplexer switches the connection relationship between the plurality of signal lines and the plurality of first signal holding units, and
wherein the plurality of first signal holding units is controlled such that power consumption of a part of the plurality of first signal holding units is different from power consumption of another part of the plurality of first signal holding units.

15. The photoelectric conversion device according to claim 14,
wherein the plurality of pixels is arranged to form a plurality of columns, and wherein the plurality of signal lines is arranged to correspond to the plurality of columns, respectively.

16. The photoelectric conversion device according to claim 14,
  wherein the plurality of pixels is arranged to form a plurality of columns, and
  wherein two of the plurality of signal lines are arranged to correspond to one of the plurality of columns.

17. The photoelectric conversion device according to claim 13 comprising a plurality of the first signal holding units,
  wherein the photoelectric conversion device further comprising:
    an analog-to-digital conversion unit configured to convert an analog signal input from the first signal holding unit into a digital signal; and
    a second multiplexer configured to switch a connection relationship between the plurality of first signal holding units and the analog-to-digital conversion unit.

18. The photoelectric conversion device according to claim 1,
  wherein the pixel is arranged in a first substrate, and
  wherein the first signal holding unit is arranged in a second substrate stacked on the first substrate.

19. The photoelectric conversion device according to claim 18 further comprising a signal processing circuit configured to process a signal held in the first signal holding unit,
  wherein the signal processing circuit is arranged in a third substrate stacked on the first substrate and the second substrate.

20. Equipment comprising:
  the photoelectric conversion device according to claim 1; and
  at least any one of:
  an optical device adapted for the photoelectric conversion device,
  a control device configured to control the photoelectric conversion device,
  a processing device configured to process a signal output from the photoelectric conversion device,
  a display device configured to display information obtained by the photoelectric conversion device,
  a storage device configured to store information obtained by the photoelectric conversion device, and
  a mechanical device configured to operate based on information obtained by the photoelectric conversion device.

21. The equipment according to claim 20, wherein the processing device processes image signals generated by a plurality of photoelectric conversion units, respectively, and acquires distance information on a distance from the photoelectric conversion device to an object.

22. A photoelectric conversion device comprising:
  a plurality of pixels each configured to output a signal corresponding to incident light by photoelectric conversion;
  a plurality of signal lines connected to the plurality of pixels;
  a plurality of first signal holding units; and
  a plurality of multiplexers, corresponding signal lines of the plurality of signal lines being connected to an input side of each of the plurality of multiplexers, a corresponding first signal holding unit of the plurality of first signal holding units being connected to an output side of each of the plurality of multiplexers,
  wherein each of the plurality of first signal holding units includes a first capacitor element and an amplifier circuit connected to the first capacitor element, and
  wherein the amplifier circuit included in a first signal holding unit of a part of the plurality of first signal holding units and the amplifier circuit included in a first signal holding unit of another part of the plurality of first signal holding units are connected to different control lines.

23. A photoelectric conversion device comprising:
  a pixel configured to output a signal corresponding to incident light by photoelectric conversion;
  a signal line connected to the pixel; and
  a first signal holding unit to which a signal is input from the pixel via the signal line,
  wherein the first signal holding unit includes:
    a first capacitor element and a second capacitor element each having a first terminal and a second terminal and each configured to hold a signal input from the signal line to the first terminal;
    an amplifier circuit having an input terminal and an output terminal, the second terminal of the first capacitor element and the second terminal of the second capacitor element being connected to the input terminal;
    a first switch connected between the first terminal of the first capacitor element and the output terminal of the amplifier circuit;
    a second switch connected between the first terminal of the second capacitor element and the output terminal of the amplifier circuit;
    a third switch connected to the input terminal of the amplifier circuit;
    a fourth switch connected between the signal line and the first terminal of the first capacitor element; and
    a fifth switch connected between the signal line and the first terminal of the second capacitor element,
  wherein in a period in which a signal from the pixel is held in the first capacitor element, the third switch is turned off before the fourth switch is turned off, and
  wherein in a period in which a signal from the pixel is held in the second capacitor element, the third switch is turned off before the fifth switch is turned off.

* * * * *